(12) United States Patent
Hu et al.

(10) Patent No.: US 9,553,050 B2
(45) Date of Patent: Jan. 24, 2017

(54) SEMICONDUCTOR DEVICE

(71) Applicant: KABUSHIKI KAISHA TOSHIBA, Tokyo (JP)

(72) Inventors: Ming Hu, Yokkaichi Mie (JP); Akira Yotsumoto, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/626,674

(22) Filed: Feb. 19, 2015

(65) Prior Publication Data

US 2016/0064333 A1    Mar. 3, 2016

Related U.S. Application Data

(60) Provisional application No. 62/041,900, filed on Aug. 26, 2014.

(51) Int. Cl.
| | |
|---|---|
| H01L 27/06 | (2006.01) |
| H01L 23/532 | (2006.01) |
| H01L 21/285 | (2006.01) |
| H01L 23/485 | (2006.01) |
| H01L 21/768 | (2006.01) |

(52) U.S. Cl.
CPC ... *H01L 23/53266* (2013.01); *H01L 21/28518* (2013.01); *H01L 21/76805* (2013.01); *H01L 21/76846* (2013.01); *H01L 21/76855* (2013.01); *H01L 23/485* (2013.01); *H01L 21/76895* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,514,910 | A | 5/1996 | Koyama | |
| 5,973,402 | A * | 10/1999 | Shinriki | H01L 21/28556 257/763 |
| 5,990,011 | A * | 11/1999 | McTeer | H01L 21/76843 216/38 |
| 2002/0000595 | A1* | 1/2002 | Ohyu | H01L 27/10897 257/296 |
| 2002/0056920 | A1* | 5/2002 | Fujinaga | H01L 21/768 257/774 |
| 2009/0001437 | A1* | 1/2009 | Won | H01L 21/31144 257/300 |

FOREIGN PATENT DOCUMENTS

| | | |
|---|---|---|
| JP | H05029316 | 5/1993 |
| JP | H06-061359 | 4/1994 |

* cited by examiner

*Primary Examiner* — Thao P Le
(74) *Attorney, Agent, or Firm* — Patterson & Sheridan, LLP

(57) ABSTRACT

A semiconductor device includes a semiconductor substrate, an interlayer insulating film on the semiconductor substrate and having a first hole extending therethrough, and a contact portion in the first hole of the interlayer insulating film. The contact portion includes a first silicon film along an inner surface of the first hole of the interlayer insulating film.

18 Claims, 28 Drawing Sheets

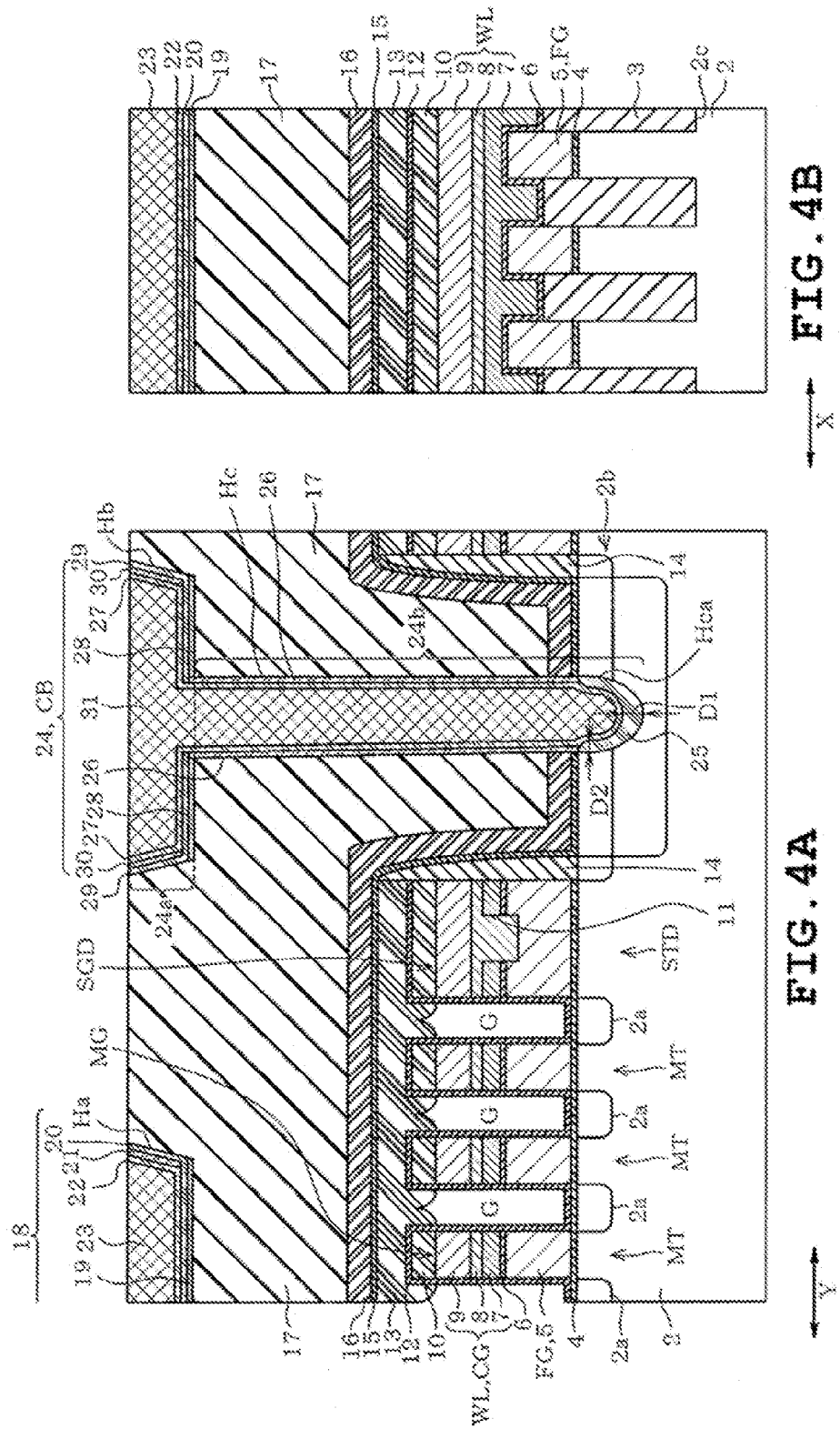

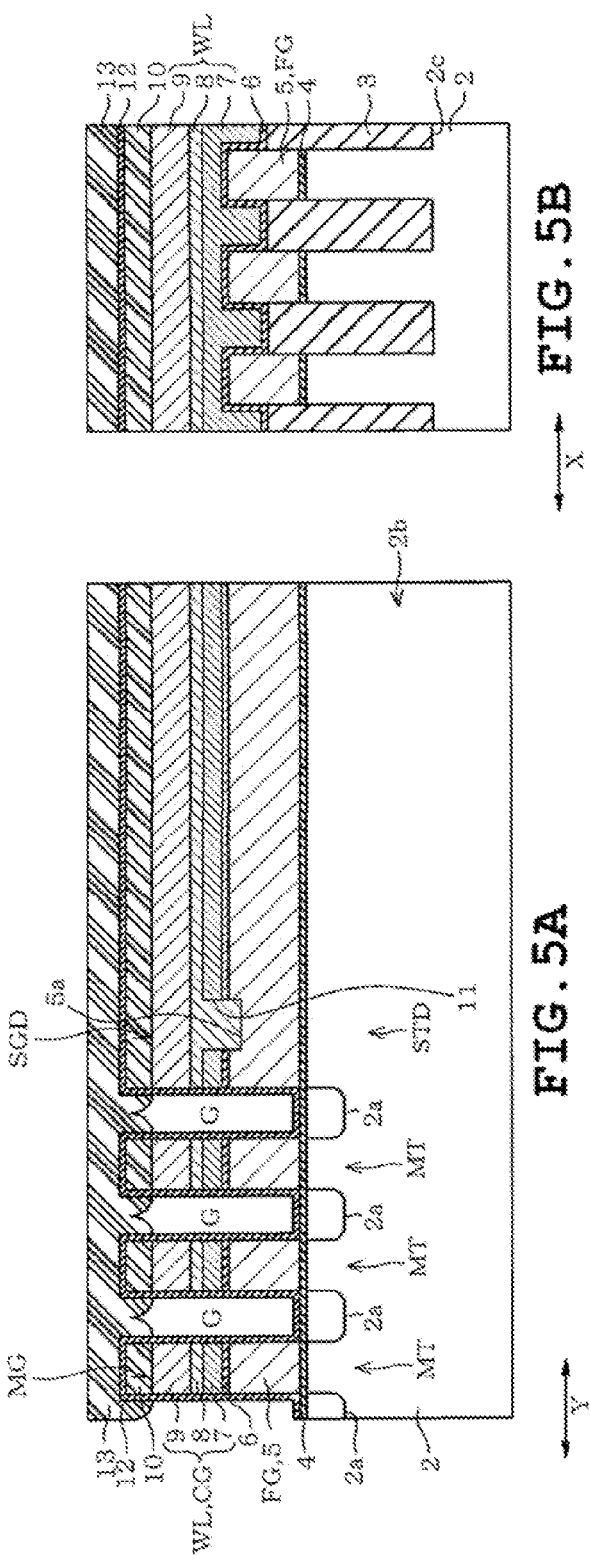

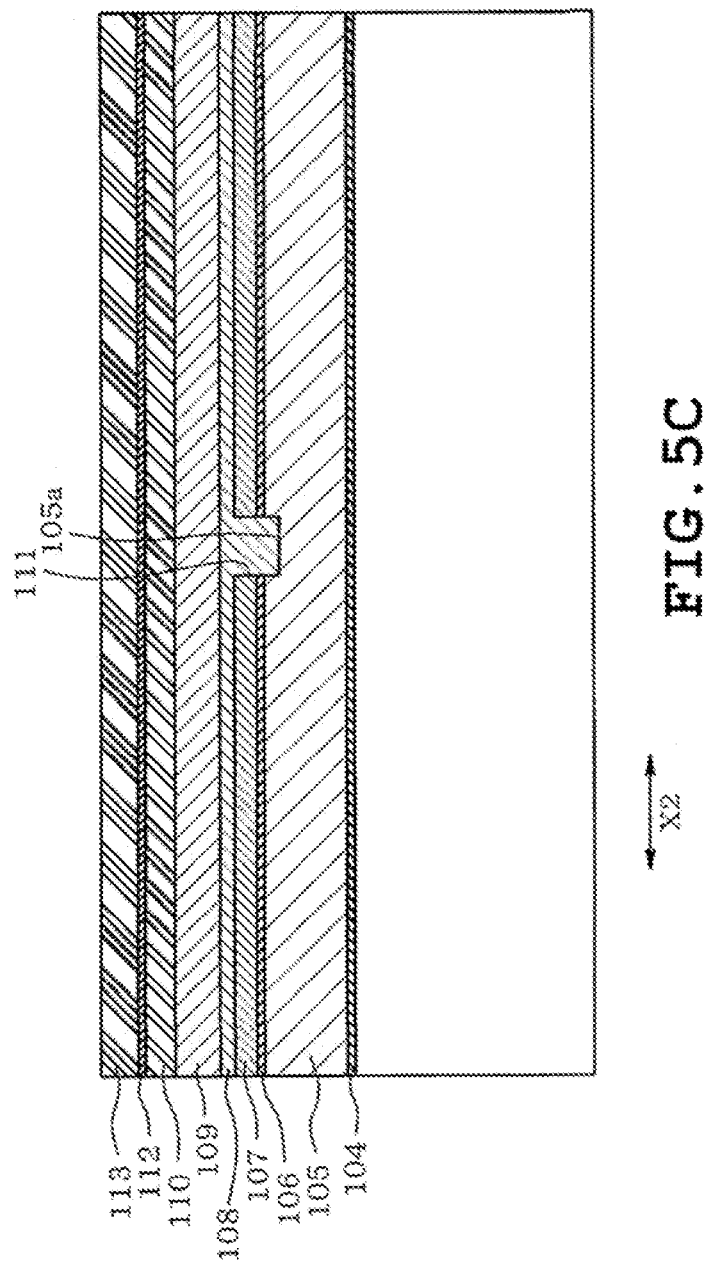

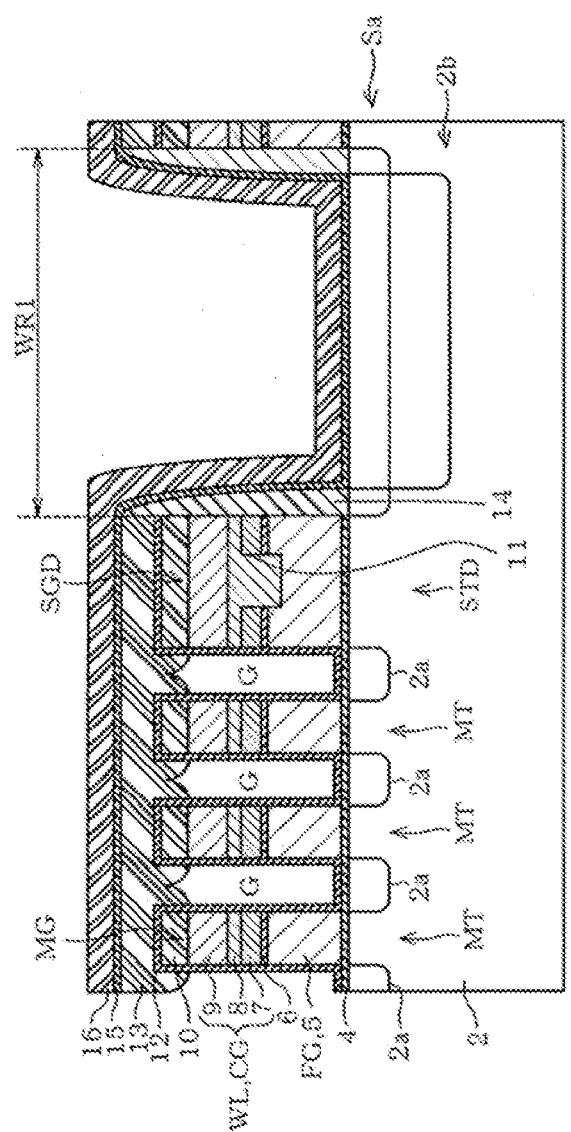

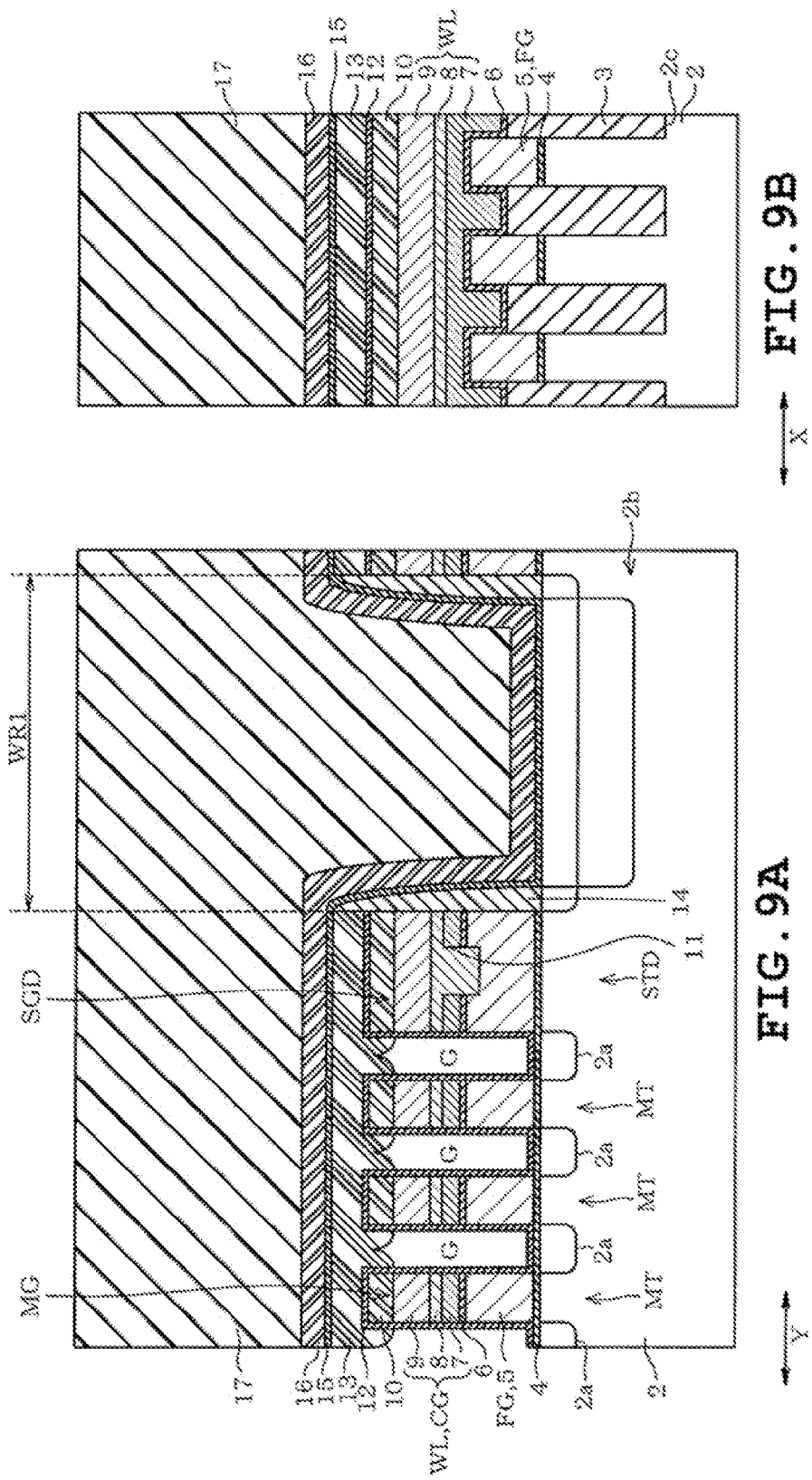

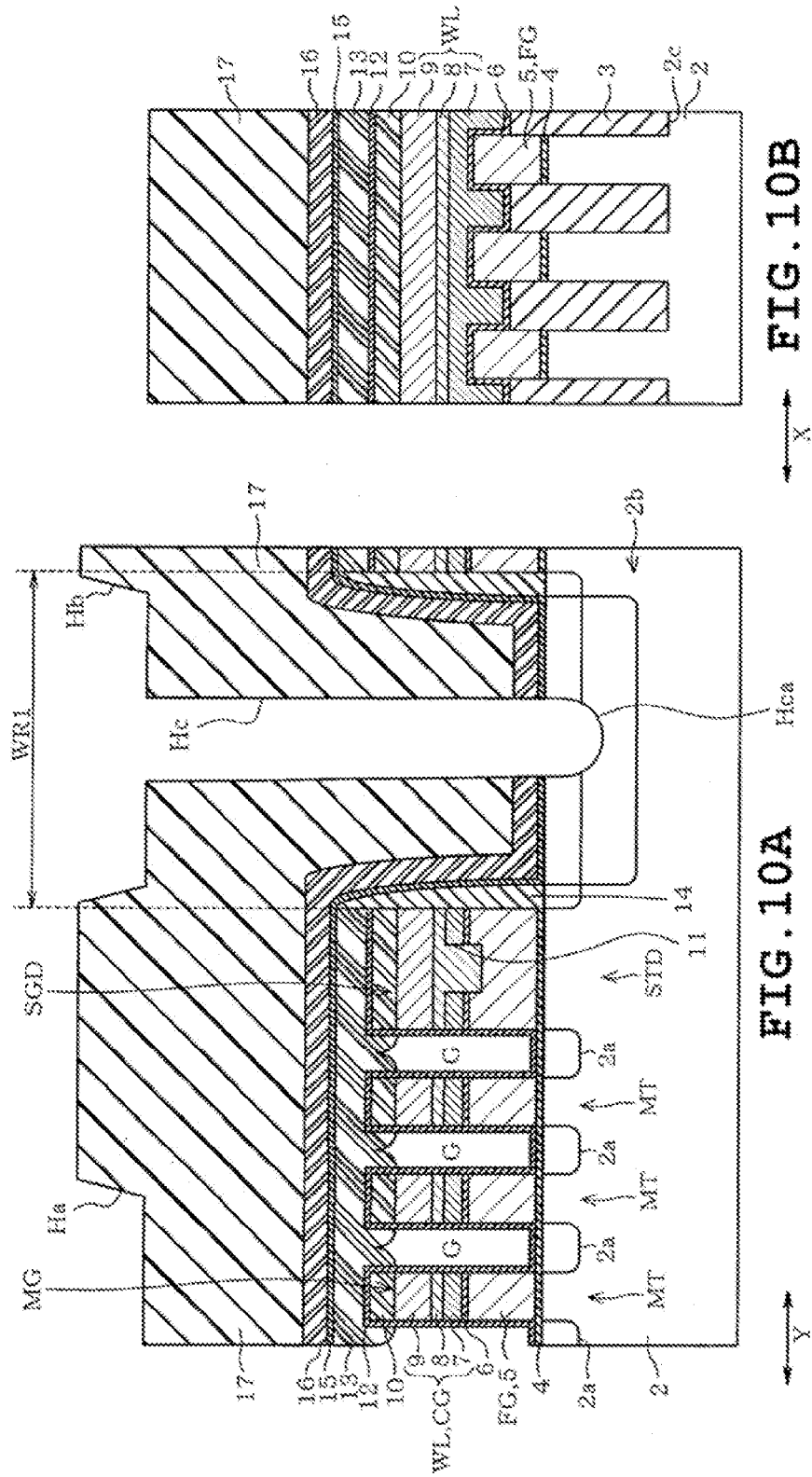

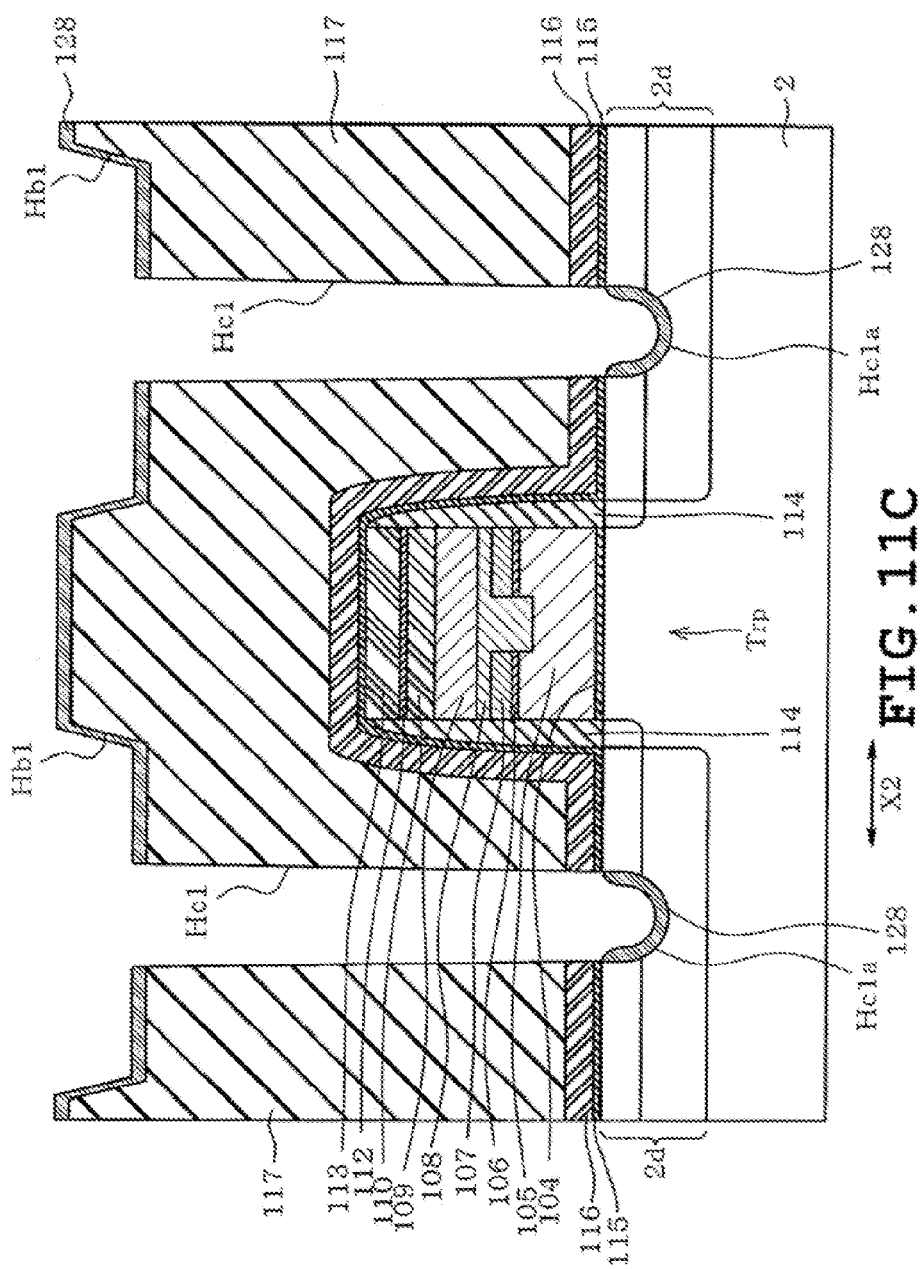

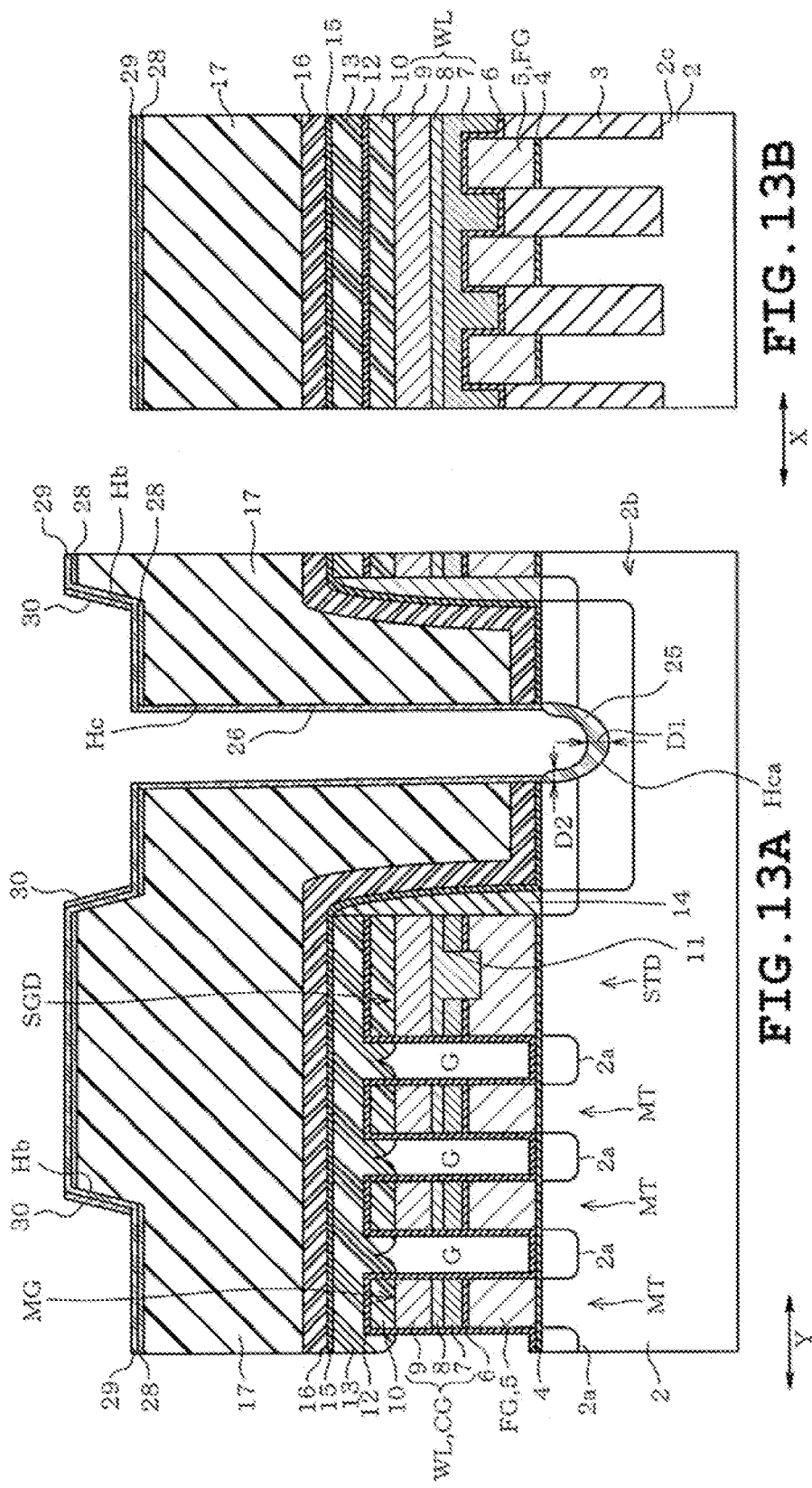

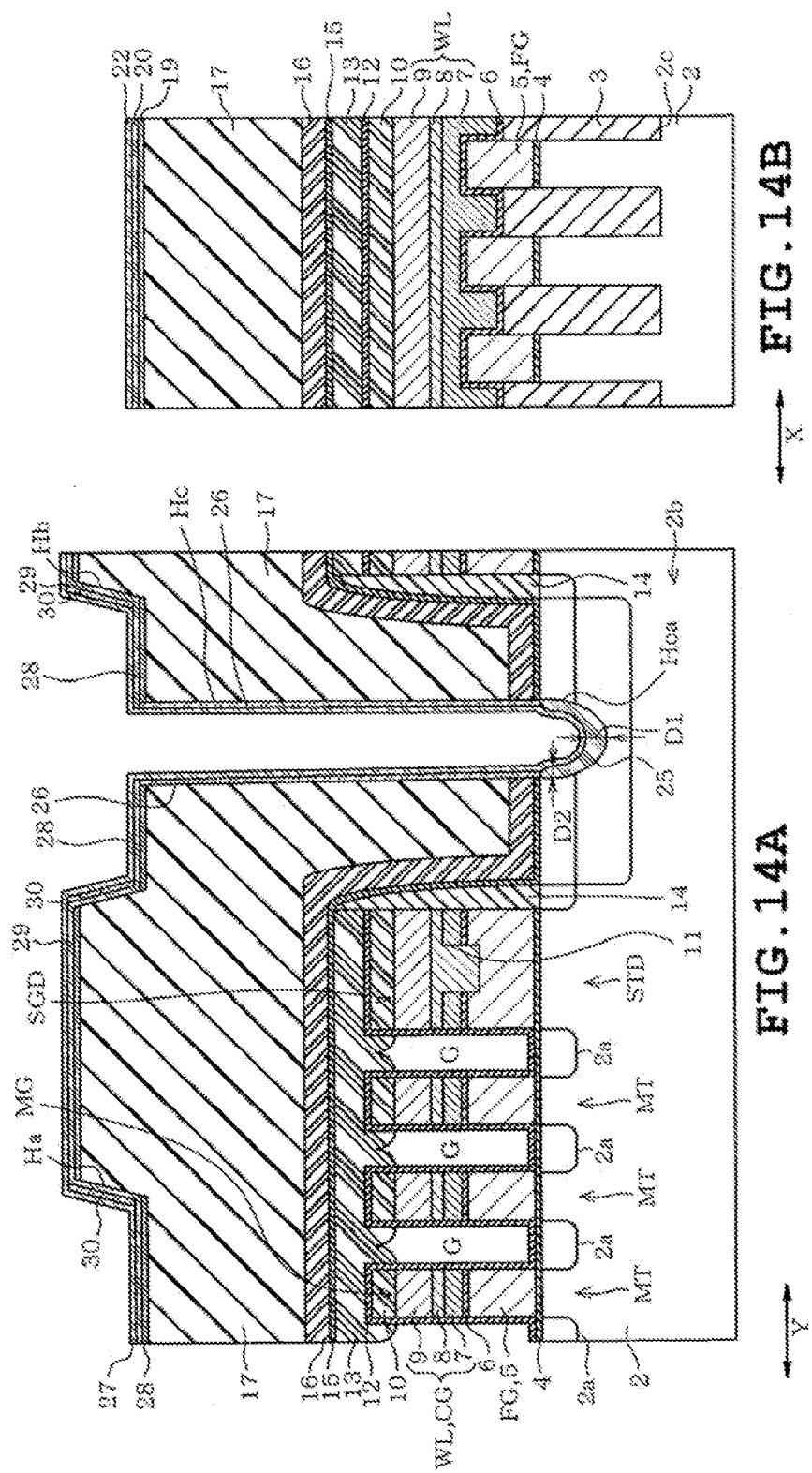

SEMICONDUCTOR DEVICE

This application is based upon and claims the benefit of priority from U.S. Provisional Application No. 62/041,900, filed Aug. 26, 2014, the entire contents of which are incorporated herein by reference.

FIELD

Embodiments described herein relate to a semiconductor device.

BACKGROUND

In a semiconductor device such as, for example, a flash memory or a logic circuit, a device is formed on or in a semiconductor substrate, and an interlayer insulating film is formed to cover the device. In addition, a wiring layer is formed on the interlayer insulating film, and a contact is formed through the interlayer insulating film to electrically connect the wiring layer and certain device regions, such as source and drain regions of the devices, which are on or in the semiconductor substrate. The contact may be created by forming a hole in the interlayer insulating film which extends from a location on or in one side of the interlayer insulating film where a line, for example a bit line, is later formed, and lining the walls of the hole with a metal such as titanium (Ti), covering the titanium layer with a barrier metal film such as titanium nitride (TiN), and filling the hole with a main contact material such as tungsten. The underlying metal layer (e.g., titanium) is reacted with the silicon of the semiconductor at the base of the hole to form a contact silicide layer. However, when the metal of the contact reacts with the semiconductor substrate, during formation of a contact silicide at the interface of a contact extending through a first level insulator and the semiconductor substrate, if the amount of metal being reacted is large, excess silicon is required to complete the silicidation reaction, and a gap can be generated between the silicide layer and the semiconductor substrate where silicon has been drawn out of the substrate for the silicidation reaction with the titanium or other metal.

DESCRIPTION OF THE DRAWINGS

FIG. 4A is an example of a schematic longitudinal sectional view of a portion taken along line 4A-4A in FIG. 2 according to the embodiment.

FIG. 4B is an example of a schematic longitudinal sectional view of a portion taken along line 4B-4B in FIG. 2 according to the embodiment.

FIGS. 5A, 6A, 7A, 8A, 9A, 10A, 11A, 12A, 13A, 14A, and 15A are schematic longitudinal sectional views each illustrating the result of one or more steps of a manufacturing process on the portion of the substrate along section 4A-4A in FIG. 2 according to the embodiment.

FIGS. 5B, 6B, 7B, 8B, 9B, 10B, 11B, 12B, 13B, 14B, and 15B are examples of a schematic longitudinal sectional view each illustrating one or more steps of a manufacturing process on the portion of the substrate along section 4B-4B in FIG. 2 according to the embodiment.

FIGS. 5C, 6C, 7C, 8C, 9C, 10C, 11C, 12C, 13C, 14C, and 15C are examples of a schematic longitudinal sectional view each illustrating one or more steps of a manufacturing process on the portion of the substrate along section 4C-4C in FIG. 3 according to the embodiment.

DESCRIPTION

Figure 1:
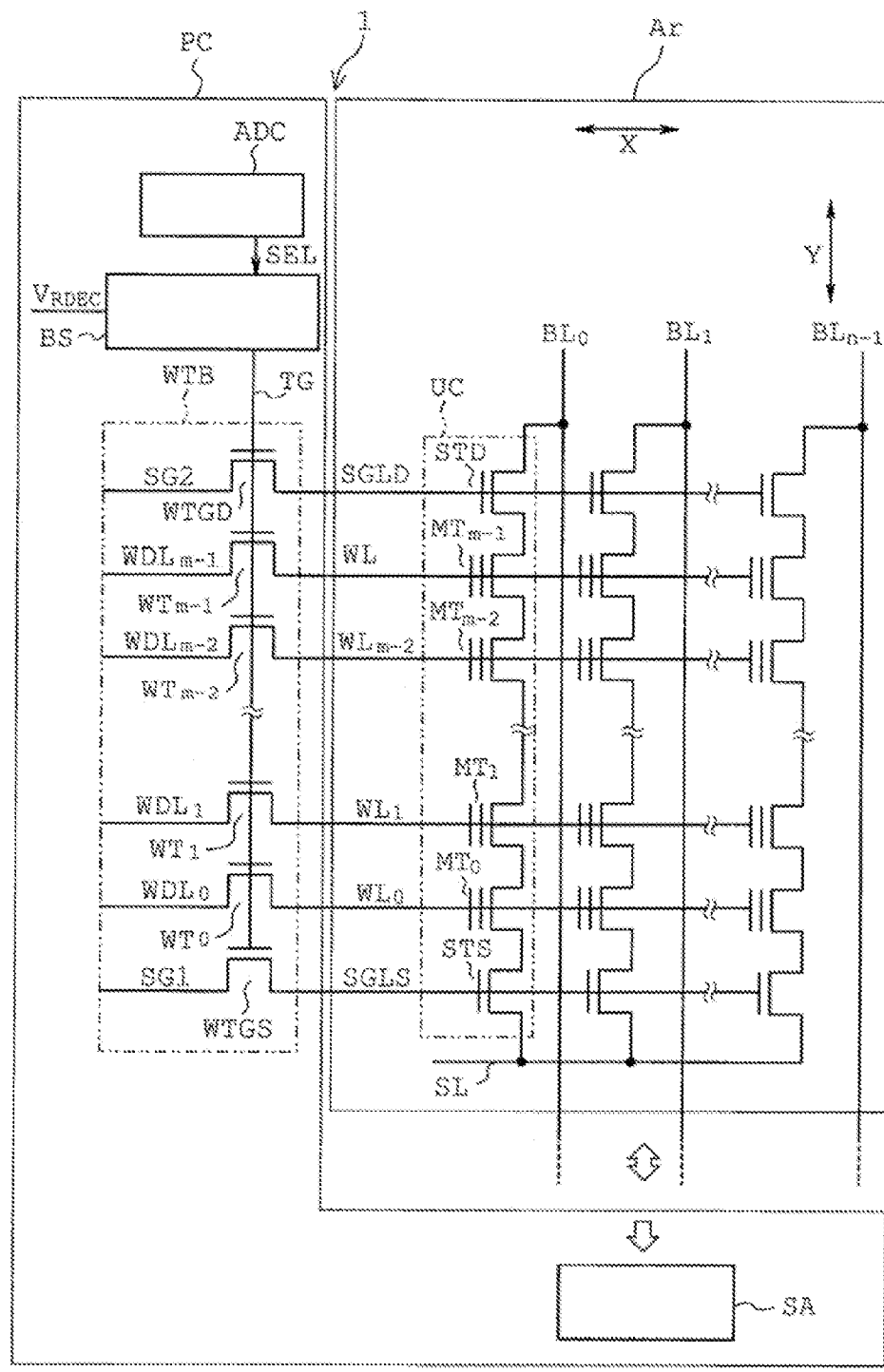
FIG. 1 is an example of a schematic diagram illustrating a partial electrical configuration of a memory cell region and a peripheral circuit region of a nonvolatile semiconductor memory device according to an embodiment.

A semiconductor device according to an embodiment includes: a semiconductor substrate, an interlayer insulating film on the semiconductor substrate and having a first hole extending therethrough, and a contact portion in the first hole of the interlayer insulating film. The contact portion includes a first silicon film along an inner surface of the first hole of the interlayer insulating film.

Hereinafter, some embodiments will be described. The same or similar components in the embodiments will be denoted by the same or similar reference numerals and signs, and a repeated description thereof will be omitted when it is not necessary. The description will be made with a focus on characteristic portions of the embodiments.

Hereinafter, reference will be made to FIGS. 1 to 15C to describe an embodiment in which a semiconductor device is applied to a NAND type flash memory device. In addition, the drawings are schematically illustrated, and a relationship between a thickness and a planar size, a ratio of a thickness of each layer, and the like do not necessarily coincide with those of an actual device. In addition, vertical and horizontal directions indicate relative directions when a circuit formation surface side of a semiconductor substrate faces upwards, and do not necessarily coincide with directions based on a gravitational acceleration direction.

FIG. 1 is an example of a schematic block diagram illustrating an electrical configuration of a NAND type flash memory device, including a memory cell array Ar and a peripheral circuit PC. The memory cell array has a large number of memory cells disposed in a matrix. The peripheral circuit is configured to read from, write to, and erase the memory cells of the memory cell array Ar.

In the memory cell array Ar within a memory cell region, a plurality of cell units UC are disposed. Each cell unit UC includes a selection transistor STD connected to a bit line BL side, a selection transistor STS connected to a source line SL side, and a plurality of (for example, 64(=m)per cell unit) memory cells (equivalent to semiconductor elements) MT ($MT_{m-1}$ to $MT_0$), as semiconductor elements, which are connected to each other in series between the two selection transistors STD and STS. Meanwhile, a dummy transistor may be provided between the selection transistor STD and the memory cell MT adjacent to the selection transistor STD, and one or a plurality of dummy transistors may be provided between the selection transistor STS and the memory cell MT adjacent to the selection transistor STS.

One block of the memory array Ar includes n columns of cell units UC which are aligned in parallel with one another and spaced apart in an X direction (horizontal direction in FIG. 1). The memory cell array Ar includes a plurality of blocks spaced apart from one another in a Y direction (vertical direction in FIG. 1). In addition, FIG. 1 illustrates only one block for the purpose of simplifying a description of the device.

A peripheral circuit region is provided in the vicinity of the memory cell region, and a peripheral circuit PC is disposed in the peripheral circuit region in the vicinity of the memory cell array Ar. The peripheral circuit PC includes an address decoder ADC, a sense amplifier SA, a booster circuit BS including a charge pump circuit, a transfer transistor unit WTB, and the like. The address decoder ADC is electrically connected to the transfer transistor unit WTB through the booster circuit BS.

The address decoder ADC selects one block of the device in response to an address signal applied thereto from the outside. The booster circuit BS boosts a driving voltage which is supplied from the outside when a selection signal of a block is applied, and supplies a predetermined voltage to the transfer gate transistors WTGD, WTGS, and WT through a transfer gate line TG. The transfer transistor unit WTB includes the transfer gate transistor WTGD, the transfer gate transistor WTGS, the word line transfer gate transistors WT, and the like. A transfer transistor unit WTB is provided to correspond to each block.

One of a drain and a source of the transfer gate transistor WTGD are connected to a selection gate driver line SG2, and the other of the source and drain is connected to a selection gate line SGLD. One of a drain and a source of the transfer gate transistor WTGS are connected to a selection gate driver line SG1, and the other of the drain and source is connected to a selection gate line SGLS. In addition, one of a drain and source of each of the transfer gate transistors WT are connected to a word line driving signal line WDL, and the other of the drain and source is connected to a word line WL provided within the memory cell array Ar.

In the plurality of cell units UC arrayed in the X direction, gates (SGD of FIG. 4A) of the respective selection transistors STD are electrically connected to each other by the selection gate line SGLD. Gate electrodes of the respective selection transistors STS are electrically connected to each other by the selection gate line SGLS. Sources of the respective selection transistors STS are connected in common to the source line SL. Gate electrodes (MG of FIG. 4A) of the respective memory cells MT of the plurality of cell units UC arrayed in the X direction are electrically connected to each other by the word line WL.

Gate electrodes of the respective transfer gate transistors WTGD, WIGS, and WT are connected to each other in common by the transfer gate line TG, and are connected to a boosting voltage supply terminal of the booster circuit BS. The sense amplifier SA is connected to the bit lines BL, and is connected to a latch circuit that temporarily stores data when the data is read out.

Figure 2:
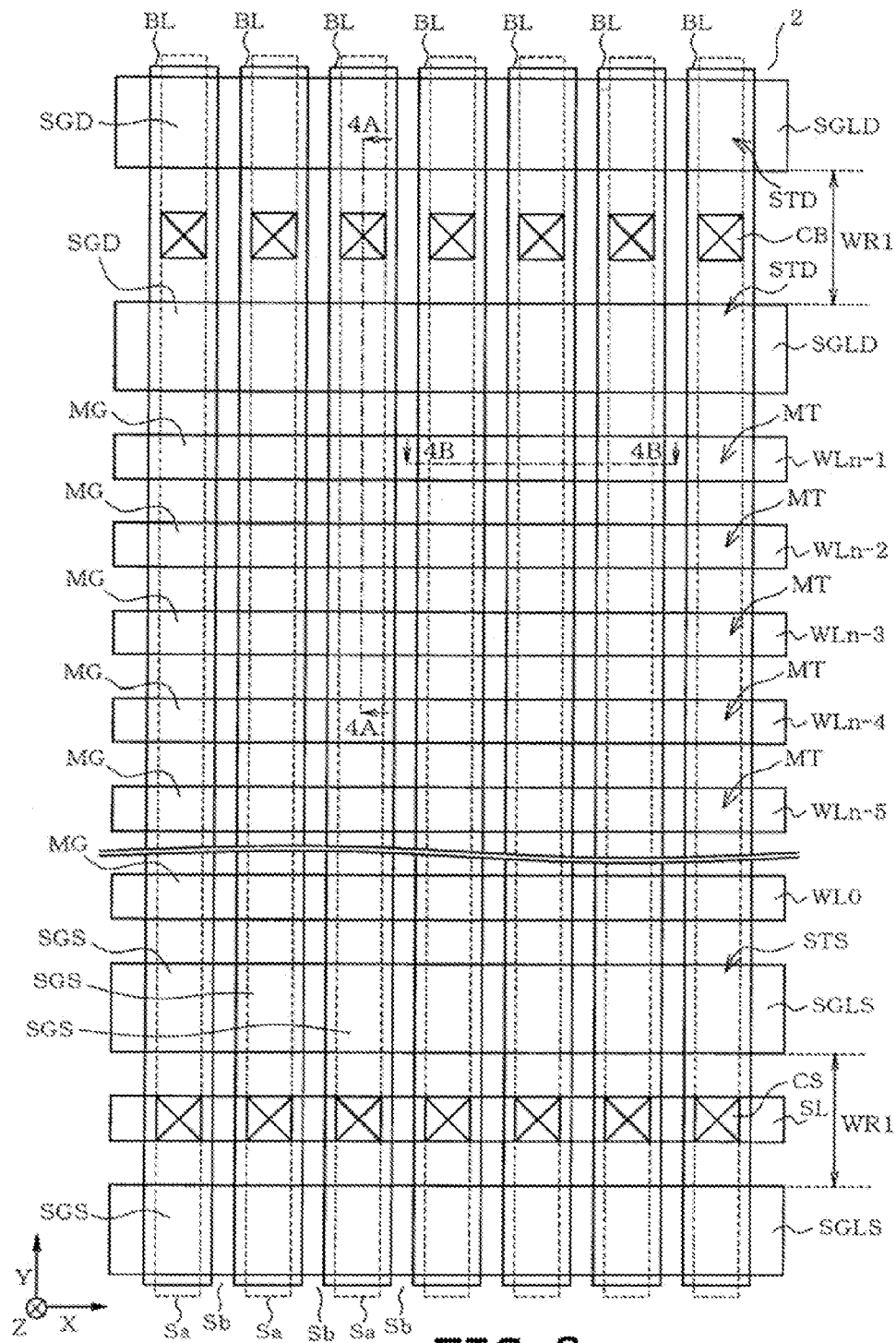
FIG. 2 is an example of a schematic plan view of the memory cell region according to the embodiment.
Figure 3:
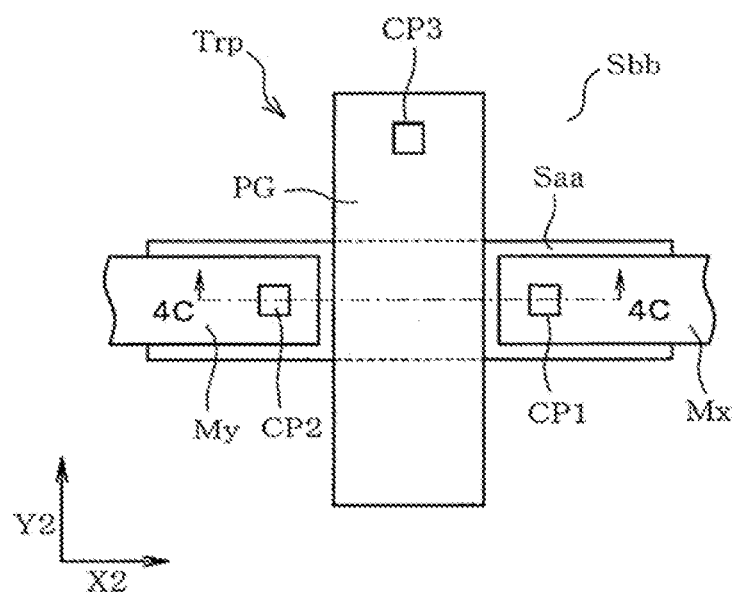
FIG. 3 is an example of a schematic plan view of a transistor in the peripheral circuit region according to the embodiment.

FIG. 2 illustrates an example of a partial layout pattern of a memory cell region, and FIG. 3 illustrates an example of a partial layout pattern of a peripheral circuit region. The peripheral circuit PC and the memory cell array Ar are formed on a semiconductor substrate 2. The semiconductor substrate 2 is formed using, for example, a p-type single crystal silicon substrate.

As illustrated in FIG. 2, in a memory cell region of the semiconductor substrate 2, element isolation areas Sb are formed in the underlying substrate and each isolation area Sb extends in the Y direction of FIG. 2. Each element isolation area Sb is configured as a trench extending in the Y direction having an insulating film (reference numeral 3 of FIG. 4B) embedded therein, and is formed to have a so-called shallow trench isolation (STI) structure.

The plurality of element isolation areas Sb are spaced apart from one another in the X direction in FIG. 2 at a predetermined interval. Thus, individual element regions (active regions) Sa extend in the Y direction in FIG. 2, and are spaced from one another in the X direction.

The word lines WL are formed to extend in a direction (X direction in FIG. 2) which is generally perpendicular to and crosses the element regions Sa. The plurality of word lines WL are spaced apart in the Y direction in FIG. 2 at a predetermined interval within the memory array Ar. Gate electrodes MG of the memory cells (of the memory cell transistors) MT are formed on the element regions Sa where the word lines WL cross the element region Sa.

A plurality of adjacent memory cells MT connected to each other in series in the Y direction constitutes a NAND string. A selection transistor STD is formed at one end of a NAND string, such that adjacent ends of two NAND strings include a selection transistor STD thereon and thus adjacent to one another in the Y direction. The plurality of selection transistors STD are provided in the X direction, and gate electrodes SGD of the plurality of selection transistors STD are electrically connected to each other through the selection gate line SGLD. Meanwhile, the gate electrode SGD of the selection transistor STD is formed on the element region Sa crossing under the selection gate line SGLD.

A bit line contact electrode CB is formed on the element regions Sa at a location between the selection transistors STD of two neighboring blocks. The bit line contact electrode CB electrically connects the bit line BL formed on the element region Sa and extending in the Y direction to the element region Sa of the semiconductor substrate 2.

FIG. 3 illustrates an example of a layout of a transistor Trp in a peripheral circuit region. The semiconductor substrate 2 (FIG. 4) is provided with element isolation areas Sbb in the peripheral circuit region. The element isolation areas Sbb are configured having a trench formed adjacent to a rectangular element region (active region) Saa thereof, and an insulating film (not illustrated) is embedded in the trench. The element isolation areas Sbb are formed as so-called shallow trench isolation (STI) structures.

The transistor Trp is formed using the element region Saa having a rectangular shape extending in an X2 direction and in a Y2 direction, and includes a gate electrode PG which is formed to cross over the element region Saa in a certain predetermined direction (Y2 direction in FIG. 3). That is, the gate electrode PG extends outwardly from the element region Saa and extends in the Y2 direction to reach the element isolation area Sbb.

The transistor Trp includes a source or a drain region (see 2d of FIG. 4C) which are formed by diffusing, for example, n-type impurities into the element regions Saa on both sides of the gate electrode PG. Contact electrodes CP1 and CP2 are formed respectively on the element regions Saa (source or drain region 2d) on opposite sides of the gate electrodes PG. The contact electrodes CP1 and CP2 connect the element regions Saa (source or drain region 2d) and wirings Mx and My disposed above the element regions Saa. In addition, a contact electrode CP3 is formed to contact the gate electrode PG, but is disposed on the element isolation area Sbb on the outer side of the element region Saa when seen in a plan view.

Figure 4C:
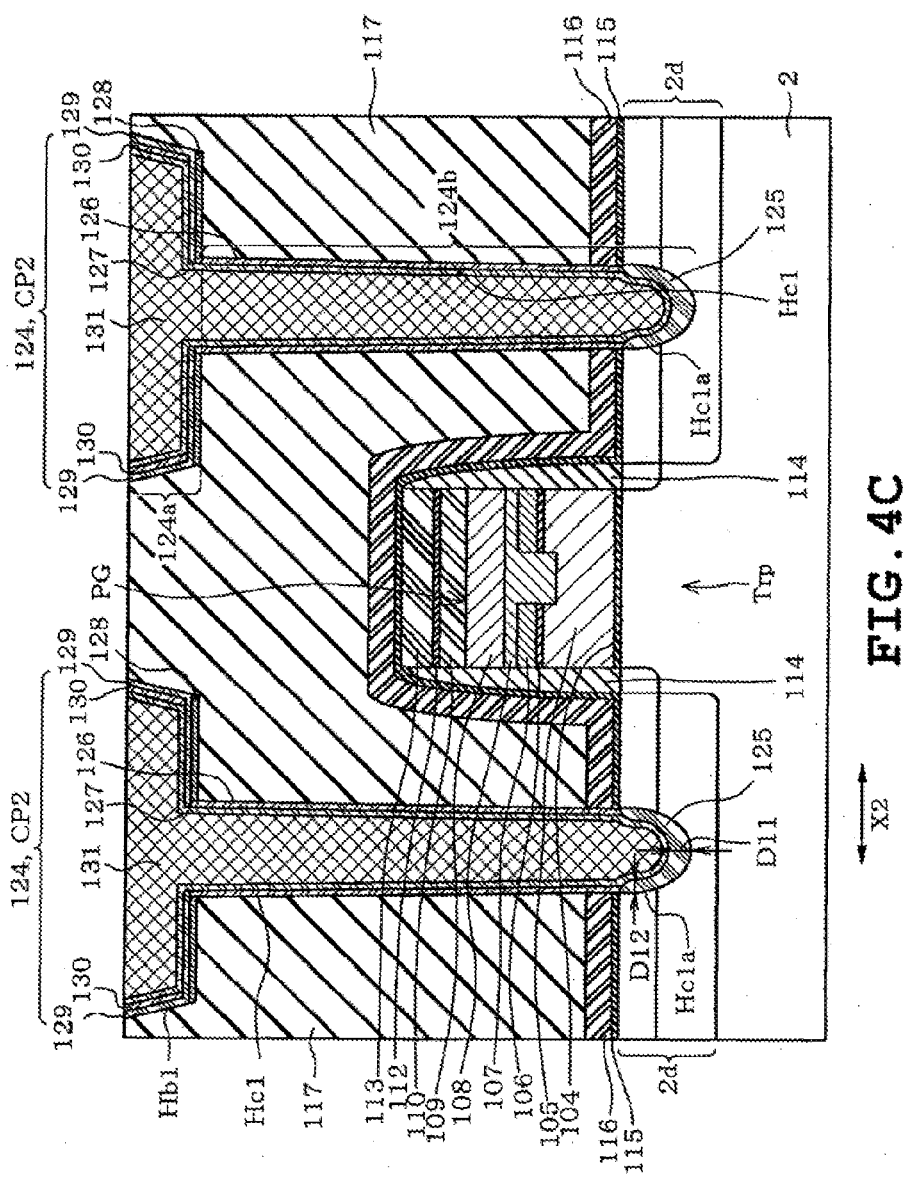
FIG. 4C is an example of a schematic longitudinal sectional view of a portion taken along line 4C-4C in FIG. 3 according to the embodiment.

FIGS. 4A and 4B are examples illustrating schematic cross-sectional structures of a selection transistor STD and adjacent memory cells MT formed in the memory cell region. FIG. 4C is an example illustrating a schematic cross-sectional structure of the transistor Trp formed in the peripheral circuit region. FIG. 4A illustrates an example of a schematic longitudinal sectional view of a portion taken along line 4A-4A of FIG. 2, and FIG. 4B illustrates an example of a schematic longitudinal sectional view of a portion taken along line 4B-4B of FIG. 2. FIG. 4C illustrates an example of a schematic longitudinal sectional view of a portion taken along line 4C-4C of FIG. 3. FIGS. 4A, 4B and FIG. 4C illustrate a state after the gate electrodes MG, SGD, and PG of the memory cell MT, the selection transistor STD, and the transistor Trp are subjected to separation processing, i.e., after they are fully formed.

In a cross-section of the memory cell region illustrated in FIG. 4B, device isolation grooves 2c are formed into the semiconductor substrate 2, and an element isolation film 3 is embedded in the device isolation grooves 2c. The element isolation film 3 is formed of an insulating film (for example, a silicon oxide film). The element isolation film 3 protrudes above the upper surface of the semiconductor substrate 2. The plurality of element isolation films 3 are spaced apart from and isolated from one another in the X direction. A gate insulating film 4 is formed on the upper surface of the semiconductor substrate 2 between adjacent element isolation films 3. The gate insulating film 4 is formed of, for example, a silicon oxide film. The gate electrode MG of the memory cell MT is formed on the upper surface of the gate insulating film 4. The gate electrode MG is configured as a stack comprising a silicon film 5, an interelectrode insulating film 6, a silicon film 7, a silicon film 8, and a tungsten (W) film 9 which are sequentially formed on the gate insulating film 4, and a silicon nitride cap film 10 is formed on the tungsten film.

In the cross-section illustrated in FIG. 4B, the silicon film 5 extends to a location above the position of the upper surface of the element isolation film 3. In addition, the interelectrode insulating film 6 is formed along the upper surface of the element isolation film 3 and the upper side surface and the upper surface of the silicon film 5.

In the memory cell region illustrated in FIG. 4A, the gate insulating film 4 is formed on the upper surface of the semiconductor substrate 2. The gate electrode MG of each of the plurality of memory cells MT and the selection gate electrode SGD of the selection transistor STD for selecting the memory cell MT are formed on the upper surface of the gate insulating film 4. Meanwhile, although not illustrated in the drawing, a selection gate electrode SGS of the selection transistor STS for selecting the memory cell MT is also formed.

The memory cells MT include the gate electrode MG and a source or a drain region 2a formed on the surface layer of the semiconductor substrate 2 on either side in the Y direction, of the gate electrode MG. The plurality of memory cells MT is adjacent to each other in the Y direction.

As described above, the gate electrodes MG of the memory cell MT are configured so that the silicon film 5, the interelectrode insulating film 6, the silicon film 7, the silicon film 8, and the tungsten (W) film 9 are sequentially formed on the gate insulating film 4 and so that the silicon nitride film 10 is formed on the tungsten film 9 as a cap film.

The silicon film 5 is formed of a p-type silicon by being doped with, for example, p-type impurities (for example, boron (B)), and is provided as an electrode film. The silicon film 5 is configured as a floating electrode FG within the memory cell MT. Similarly to the silicon film 5, the silicon films 7 and 8 are formed of a p-type silicon by being doped with p-type impurities (for example, boron (B)), and are formed as electrode films. Meanwhile, a configuration is illustrated in which a polysilicon film having p-type impurities introduced thereto is used as the silicon film 7. However, a silicon film having n-type impurities (for example, phosphorus (P)) introduced thereto may be used, and the embodiment is not limited thereto. The tungsten film 9 overlies a so-called barrier metal film (not illustrated) on the lower surface thereof, i.e., located between the tungsten film and the doped silicon of silicon film 8. The silicon films 7 and 8 and the tungsten film 9 are configured as control electrodes CG and the word line WL.

The interelectrode insulating film 6 is formed using, for example, an oxide-nitride-oxide (ONO) film, a nitride-oxide-nitride-oxide-nitride (NONON) film, or a film in which a nitride film located at an intermediate position of the ONO film or the NONON film is replaced with an insulating film having a higher dielectric constant characteristic, such as a hafnium oxide film.

As illustrated in FIG. 4A, in the surface portion of the semiconductor substrate 2, the source or the drain regions 2a are provided between the gate electrodes MG and MG and between the gate electrodes SGD and MG, and a diffusion layer 2b is provided between adjacent gate electrodes SGD and SGD having a contact (CB) extending therebetween (equivalent to below the bit line contact electrode CB of FIG. 2).

The gate electrode SGD of the selection transistor STD has substantially the same structure as that of the gate electrode MG of the memory cell MT. The gate electrode SGD has a structure in which the silicon film 5, the interelectrode insulating film 6, the silicon films 7 and 8, and the tungsten film 9 are sequentially formed on the gate insulating film 4. The silicon nitride film 10 is further formed on the tungsten film 9.

In contrast to the gate electrode MG of a memory cell MT, the gate electrode SGD is configured so that an opening 11 is formed in the center of the silicon film 7 and the interelectrode insulating film 6, and the silicon film 8 is embedded in, i.e. extends through, the opening 11, and thus the silicon films 5 and 8 contact each other and are thus electrically connected to each other.

As illustrated in FIGS. 4A and 4B, a protective film 12 is formed along the side surfaces of the gate electrode MG and SGD and the side surface and the upper surface of the silicon nitride film 10. The protective film 12 is formed of, for example, a silicon oxide film.

A gap G is provided between the gate electrodes MG and MG and between the gate electrodes MG and SGD. The gap G is provided to suppress inter-cell interference between the gate electrodes MG and MG and between the gate electrodes MG and SGD. An insulating film 13 for forming the gap G is formed on the silicon nitride film 10 on the gate electrodes MG and SGD. The insulating film 13 is formed of, for example, a silicon oxide film and the insulating films extend over the gaps G in the Y direction, to form the gaps G as "air gaps" or void regions between the adjacent the gate electrodes MG and MG and between the gate electrodes MG and SGD.

In FIG. 4A, the side surface of the selection gate electrode SGD facing the bit line contact electrode CB is formed to be flush with, i.e., it terminates generally coplanar with the side surface of the silicon nitride film 10 and the side surface of the insulating film 13 on the selection gate electrode SGD. A spacer film 14 is formed on this side surface of each of the selection gate electrode SGD, the silicon nitride film 10, and the insulating film 13.

A silicon oxide film 15 is formed along the upper surface of the insulating film 13 and the upper surface and the side surface of the spacer film 14. A silicon nitride film 16 is formed on the silicon oxide film 15 to cover the silicon oxide film 15.

An interlayer insulating film 17 is formed on the silicon nitride film 16. The interlayer insulating film 17 is formed of, for example, a silicon oxide film. A wiring portion 18 (equivalent to a second wiring portion) is formed within a hole Ha (equivalent to a fourth hole) of the interlayer insulating film 17 extending over and across the upper side of the memory cells MT. The wiring portion 18 includes a metal film 19 formed along the bottom surface of the hole Ha, a metal silicide film 20 formed along the upper surface of the metal film 19 and the inner surface of the hole Ha, a silicon film 21 (equivalent to a third silicon film) which is formed along the inner surface of the metal silicide film 20 formed along the internal surface of the hole Ha, a barrier metal film. 22 formed along the upper side of the metal film 19 and the inner surface of the silicon film. 21, and a metal film. 23 (equivalent to a main wiring film) which is embedded inside the barrier metal film 22. The wiring portion 18 is a wiring portion which is provided in order to link other conductive elements not illustrated in the drawing.

The metal film 19 is formed of, for example, titanium (Ti) or nickel (Ni). In this embodiment, a configuration in which the metal film is formed of titanium (Ti) is illustrated. The metal silicide film 20 is formed of, for example, titanium silicide (TiSi). The barrier metal film 22 is formed of, for example, titanium nitride (TiN). The metal film 23 is formed of, for example, tungsten (W).

Holes Hb and Hc are formed in the interlayer insulating film 17. Hole Hc extends through the silicon nitride film 16, and the silicon oxide film 15 and reaches the semiconductor substrate 2. The hole Hb is equivalent to a second hole, and the hole Hc is equivalent to a first hole. A hole Hca (equivalent to a third hole) extends into the semiconductor substrate from the upper surface thereof, and is connected to the innermost extent into the interlayer insulating film 17 of the hole Hc. A wiring layer 24 is configured as the contact electrode CB within the holes Hb and Hc (including Hca). The hole Hb is formed to have a width in the Y direction which is larger than a width of the hole Hc in the Y direction, and the hole Hb is formed over the hole Hc.

The wiring layer 24 includes a wiring portion 24a (equivalent to a first wiring portion), having a large width in the Y direction, which is formed to have the same height as that of the wiring portion 18 and is formed in the same portion of the interlayer insulating layer 17 as the wiring portion 18, and a contact portion 24b, having a small width, which connects a portion of a lower portion of the wiring portion 24a to the upper portion of the semiconductor substrate 2. The wiring portion 24a and the contact portion 24b are integrally formed. In addition, the wiring portion 24a is wholly located above the memory cell MT and is formed in an upper portion of the interlayer insulating film 17.

The wiring layer 24 includes a metal silicide film 25 formed at the bottom of the hole Hca, a silicon film 26 (equivalent to a first silicon film) which is formed of polysilicon along the inner surface of the hole Hc and terminating at hole Hca, a barrier metal film 27 formed over the inner (interior of the hole facing) surfaces of the silicon film 26 and the metal silicide film 25, a metal film 28 located at the base of the wiring portion 24a on the lower surface of hole Ha, a metal silicide film 29 formed along the upper surface of the metal film 28 and along the inner surfaces of the sides of the hole Hb, a silicon film 30 (equivalent to a second silicon film) which is formed of polysilicon along the inner surface of the metal silicide film 29, and a metal film 31, as a main contact film, which is embedded inside the barrier metal film 27 and is formed in a core portion of the hole Hc and into hole Hca. The wiring layer 24 serves as the contact electrode CB for electrically connecting the semiconductor substrate 2 with upper layer wirings (for example, the bit lines BL, not illustrated in FIGS. 4A to 4B and FIG. 4D).

Figure 4D:
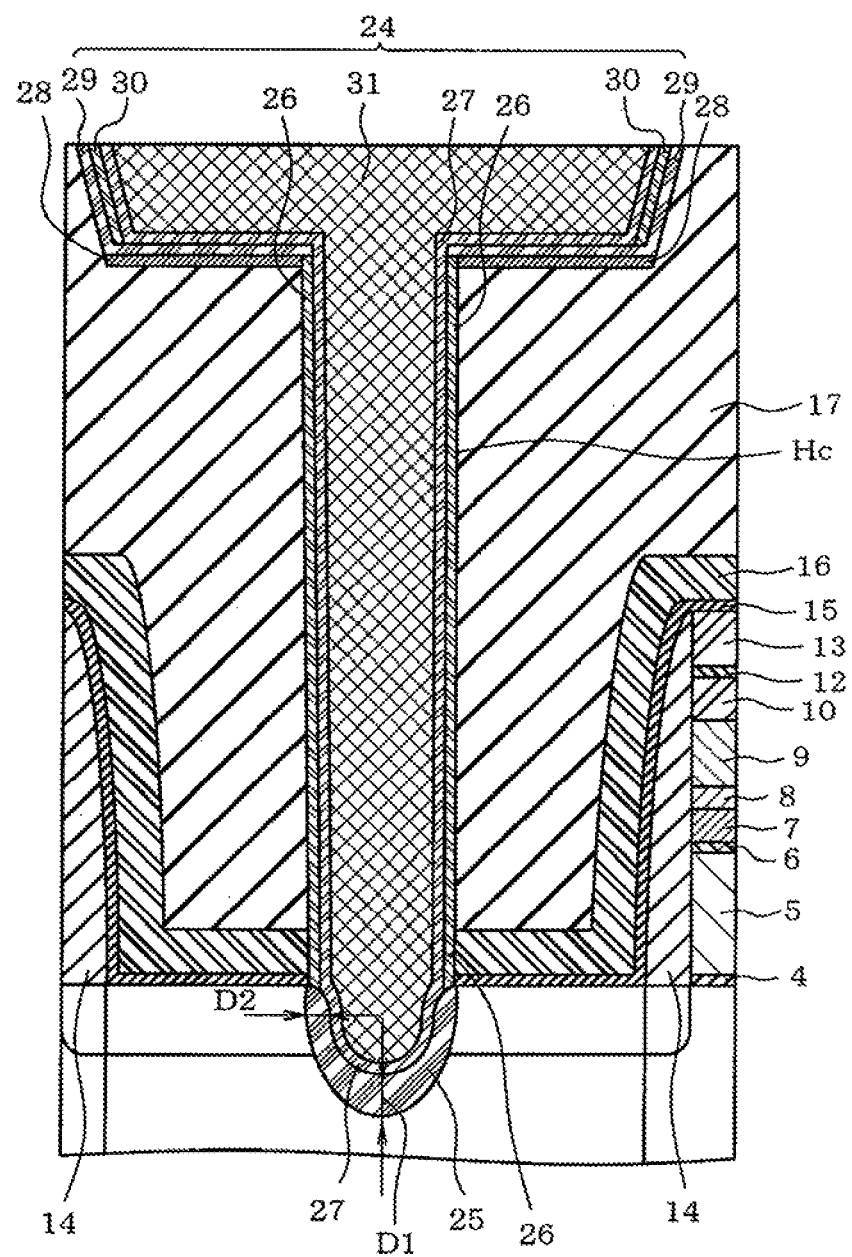
FIG. 4D is an example of an enlarged longitudinal sectional view of a contact portion of FIG. 4A according to the embodiment.

The metal silicide films 25 and 29 are formed of, for example, titanium silicide (TiSi). In a contact surface of the metal silicide film 25 with the hole Hca of the semiconductor substrate 2, when a thickness of a bottom portion is set to a first thickness D1 and a thickness of a side portion is set to a second thickness D2, the first thickness D1 is larger than the second thickness D2. For example, the silicon film 26 is formed only above the upper surface (main surface) of the semiconductor substrate 2, i.e., it does not extend into hole Hca. The metal film. 28 is formed of, for example, titanium (Ti) or nickel (Ni). In this embodiment, a configuration in which the metal film 28 is formed of titanium (Ti) is illustrated. The barrier metal film 27 is formed of, for example, titanium nitride (TiN). The metal film 31 is formed of, for example, tungsten (W). As illustrated in FIGS. 4A and 4D, the surface layer of the semiconductor substrate 2 is provided with the diffusion layer 2b, having a lightly doped drain (LDD) structure or a double doped drain (DDD) structure, for connecting with the contact portion 24b. The metal silicide film 25 of the contact portion 24b mainly comes into contact with the diffusion layer 2b.

Next, the structure of the transistor Trp in the peripheral circuit region will be described with reference to FIG. 4C. The layer stack of the transistor Trp on the semiconductor substrate 2 in the peripheral circuit region is substantially the same layer stack as is in the structure of the selection transistor STD mentioned above. Meanwhile, in FIG. 4C illustrating the structure within the peripheral circuit region, films manufactured using the same main material in the same manufacturing process as the memory cell region illustrated in FIGS. 4A and 4B or in the previous or subsequent manufacturing process of the memory cell region are denoted by reference numerals 104 to 131 by adding 100 to the components 4 to 31 illustrated in FIGS. 4A and 4B, for convenience of description. Therefore, the films have different reference numerals, but illustrate films formed of the same main material.

As illustrated in FIG. 3, the semiconductor substrate 2 is processed in the peripheral region of the transistor Trp, and the element region Saa has a structure in which the vicinity thereof is surrounded by the element isolation area Sbb. In a region where the transistor Trp is formed, a gate insulating film 104 is formed on the upper surface of the semiconductor substrate 2. Since a breakdown voltage of the gate insulating film 104 varies depending on the type of the transistor Trp, the gate insulating film is formed to have a larger film thickness in a transistor having a breakdown voltage which is higher than a predetermined value.

The gate electrode PG is formed on the gate insulating film 104. The gate electrode PG is comprised of a silicon film 105, an interelectrode insulating film 106, a silicon film 107, a silicon film 108, and a tungsten (W) film 109 sequentially formed or stacked on the gate insulating film 104, and a silicon nitride film 110 is formed on the tungsten film 109 as a cap film.

The silicon film 105 is formed of an n-type semiconductor by being doped with, for example, n-type impurities (for example, phosphorus (P)), and is formed as an electrode film. The silicon films 107 and 108 are formed of n-type films by being doped with, for example, n-type impurities (for example, phosphorus (P)), and are formed as electrode films. Meanwhile, a configuration is illustrated in which n-type impurities are introduced to the silicon films 105, 107, and 108. However, p-type impurities (for example, boron (B)) may be introduced, and the embodiment is not limited thereto.

The interelectrode insulating film 106 is formed using, for example, an oxide-nitride-oxide (ONO) film, a nitride-oxide-nitride-oxide-nitride (NONON) film, or a film in which a nitride film located at an intermediate position of the ONO film or the NONON film is replaced with an insulating film having a high dielectric constant characteristic.

The gate electrode PG is configured so that an opening is formed in the center of the silicon film 107 and the interelectrode insulating film 106 and so that a concave portion is formed in the center of an upper portion of the silicon film 105. The silicon film 108 is embedded in the opening and the concave portion, and the tungsten film 109 and the silicon nitride film 110 are formed on the silicon film 108.

A protective film 112 is formed on the upper surface of the silicon nitride film 110, and an insulating film 113 is formed on the protective film 112. Side surfaces, in the X2 direction, of the gate insulating film 104, the silicon film 105, the interelectrode insulating film. 106, the silicon films 107 and 108, the tungsten film 109, the silicon nitride film 110, the protective film 112, and the insulating film 113 are flush with, i.e. generally coplanar with, each other.

A spacer film 114 is formed on the side surfaces of the gate insulating film 104, the silicon film 105, the interelectrode insulating film. 106, the silicon films 107 and 108, the tungsten film 109, the silicon nitride film 110, the protective film 112, and the insulating film on either side thereof in the X2 direction.

A silicon oxide film 115 is formed on the upper surface of the insulating film 113 and the upper surface and the side surface of the spacer film 114, and a silicon nitride film 116 is formed on the silicon oxide film 115 to cover the silicon oxide film 115.

An interlayer insulating film 117 is formed on the silicon nitride film 116. Holes Hb1 and Hc1 are formed in the interlayer insulating film 117, and hole Hc1 extends through the silicon nitride film 116, and the silicon oxide film 115. In particular, the hole Hc1 is formed to reach the upper surface of the semiconductor substrate 2. The hole Hb1 is equivalent to a second hole, and the hole Hc1 is equivalent to a first hole. The hole Hc1 is formed to extend to the upper surface layer of the semiconductor substrate 2 to connect to a hole Hc1a (equivalent to a third hole) extending inwardly of the semiconductor substrate 2. The hole Hb1 is formed to be located at an upper portion of the hole Hc1 and above the gate electrode PG, and a width of the hole Hb1 is larger than a width of the hole Hc1.

Each of the holes Hc1 is spaced from the adjacent side of the gate electrode PG, in the X2 direction, and to reach the upper portion of the semiconductor substrate 2. A wiring layer 124 is formed in the holes Hb1, Hc1, and Hc1a as a contact electrode CP1 or CP2. The wiring layer 124 includes a wiring portion 124a, having a large width, which is formed to have the same height as those of the wiring portions 18 and 24a and is in the same portion of the interlayer insulating layer 117 (17) as the wiring portions, and a contact portion 124b, having a small width, which connects a portion of a lower portion of the wiring portion 124a and the upper portion of the semiconductor substrate 2. The wiring portion 124a is located wholly above the gate electrode PG.

The wiring layer 124 includes a metal silicide film 125 formed at the bottom of the hole Hc1, a silicon film 126 formed of polysilicon along the inner surface of the hole Hc1, a barrier metal film 127 formed along the inner surface of the silicon film 126 and the upper surface of the metal silicide film 125, a metal film 128 located at the bottom of the wiring portion 124a, a metal silicide film 129 formed along the upper surface of the metal film 128 and along the inner surface of the hole Hb1, a silicon film 130 formed of polysilicon on the inner surface of the metal silicide film 129 which is formed along the inner surface of the hole Hb1, and a metal film 131, as a main contact film, which is embedded inside the barrier metal film 127. The wiring layer 124 is configured as the contact electrode CP1 or CP2 for electrically connecting the semiconductor substrate 2 with upper layer wirings (for example, the bit lines BL, not illustrated in FIGS. 4A to 4B and FIG. 4D).

The metal silicide films 125 and 129 are formed of, for example, titanium silicide (TiSi). At a contact surface of the metal silicide film 125 with the hole Hc1a of the semiconductor substrate 2, when a thickness of a bottom portion is set to a first thickness D11 and a thickness of a side portion is set to a second thickness D12, the first thickness D11 is larger than the second thickness D12. The silicon film 126 is formed only above the upper surface (main surface) of the semiconductor substrate 2. The barrier metal film 127 is formed of, for example, titanium nitride (TiN). The metal film 128 is formed of, for example, titanium (Ti). The metal film 131 is formed of, for example, tungsten (W).

As illustrated in FIG. 4C, the surface layer of the semiconductor substrate 2 is provided with a diffusion layer 2d, having a LDD (or DDD) structure, for connecting with the contact portion 124b. The metal silicide film 125 of the contact portion 124b mainly comes into contact with the diffusion layer 2d.

Next, an example of process to manufacture the structures illustrated in FIGS. 4A to 4C (4D) will be described with reference to FIGS. 5A to 15C. Meanwhile, a description will be made below with a focus on characteristic portions, but additional processes may be added between the described processes as long as they are a generic process, or the following processes may be deleted when necessary. In addition, the processes may be appropriately changed as long as the processes may be performed practically. Meanwhile, a manufacturing method up to the structures illustrated in FIGS. 5A to 5C will be schematically described.

First, a well region and the like are formed in the surface layer of the semiconductor substrate 2 by ion implantation (not illustrated), and the gate insulating films 4 and 104 having a predetermined film thickness are formed on the upper surface of the semiconductor substrate 2. For example, a p-type single crystal silicon substrate is used as the semiconductor substrate 2. When, for example, a silicon oxide film is used as the gate insulating films 4 and 104, the gate insulating films may be formed using a thermal oxidation method based on, for example, dry $O_2$ treatment. Meanwhile, where the gate insulating films 4 and 104 have different breakdown voltage characteristics, they may be individually formed such that they have different thicknesses.

Next, the silicon films 5 and 105 are deposited on the upper surface of the gate insulating films 4 and 104, respectively, using, for example, a chemical vapor deposition (CVD) method. During deposition of the film layers 5, 105, p-type impurities (for example, boron (B)) are introduced to the silicon film 5, and n-type impurities (for example, phosphorus (P)) are introduced to the silicon film 105. Next, a silicon nitride film and the like (not illustrated) for a hard mask are formed on the upper surface of the silicon films 5 and 105, and the device isolation groove 2c is formed in the memory cell region by performing anisotropic etching on the silicon films 5 and 105, the gate insulating films 4 and 104, and the surface layer of the semiconductor substrate 2 (see FIG. 5B).

In the memory cell region, the element isolation film 3 is formed within the device isolation groove 2c using, for example, a CVD method or a spin coating method, thereby forming the element isolation area Sb. The element isolation film 3 is polished up to the position of the upper surface of the silicon nitride film for a hard mask and is then flattened. The silicon nitride film is removed using hot phosphoric acid, and etch-back processing is selectively performed on the element isolation film 3 so that the upper surface of the element isolation film. 3 is positioned below the upper surface of the silicon film 5 and above the upper surface of the gate insulating film 4 (see FIG. 5B). Meanwhile, the element isolation areas Sbb in the peripheral circuit region are formed at substantially the same time. Thus, the element regions Saa may be defined in the semiconductor substrate 2, but are not illustrated in the drawing.

The interelectrode insulating films 6 and 106 are formed on the upper surfaces and the side surfaces of the silicon films 5 and 105, respectively. The interelectrode insulating films 6 and 106 may be formed in the same process. When, for example, an ONO film is formed as the interelectrode insulating film, the ONO film may be formed using, for example, a CVD method. Further, the silicon films 7 and 107 are formed to cover the element isolation film 3 and the respective interelectrode insulating films 6 and 106. The silicon films 7 and 107 may be formed through the same process.

The opening 11 and a concave portion 5a are formed in a region corresponding to a portion (for example, a central portion) of the gate electrode SGD of the selection transistor STD using a photolithography technique and an anisotropic etching technique. In addition, an opening 111 is formed in a region corresponding to a portion (for example, a central portion) of the gate electrode PG of the peripheral transistor Trp using a photolithography technique and an anisotropic etching technique.

In these processes, an opening is formed in a portion corresponding to a partial region of the selection gate electrode SGD in the memory cell region and in a portion corresponding to a partial region of the gate electrode PG in the peripheral circuit region by applying a resist (not illustrated) and patterning the resist. The openings 11 and 111 are formed by etching the silicon films 7 and 107 and the interelectrode insulating films 6 and 106, respectively, using, for example, a reactive ion etching (RIE) method. Further, the concave portions 5a and 105a are formed in the silicon films 5 and 105, respectively. Next, the silicon films 8 and 108 are deposited on the upper surface of the silicon films 7 and 107, respectively, and are deposited to fill the concave portions 5a and 105a, respectively, using, for example, a low-pressure CVD method, and then the upper surface is aligned through etch-back processing.

The tungsten films 9 and 109 are formed on the upper surfaces of the silicon films 8 and 108 as metal films, respectively. The tungsten films 9 and 109 may be formed at the same time in the same deposition step. Subsequently, the silicon nitride films 10 and 110 are formed on the upper surface of the tungsten films 9 and 109, respectively, and then the gate electrodes MG are created out of the stack of the silicon film 5, the interelectrode insulating film 6, the silicon film 7, the silicon film 8, and the tungsten (W) film 9 and silicon nitride film 10.

The processing of the gate electrodes MG out of the layer stack in the memory cell region is performed by forming a patterned resist mask (not illustrated) on the silicon nitride film 10 forming the capping layer, performing dry etching under an anisotropic condition using the resist mask as a mask, and etching though the layer stack to form a plurality of memory gate electrodes from the layer stack. The side surface of the selection gate electrode SGD (and SGS) on the gate electrode MG side is also formed when the memory gate electrodes are formed. Meanwhile, in this manufacturing step, the peripheral circuit region is masked, and thus is not subjected to processing (see FIG. 5C). Subsequently, the silicon oxide film is formed as the protective films 12 and 112 using, for example, an LPCVD method. The protective film 12 in the memory cell region is formed along the side surfaces of the gate electrode stacked layer structures etched from the silicon films 5 and 105, the interelectrode insulating films 6, 106, silicon films 7, 107, the silicon films 8 and 108 and the tungsten films 9 and 109, and silicon nitride film. 10, 110 along the upper surface of the gate insulating film 4 exposed when the gate electrode stacked layers are etched, and along the upper surface of the silicon nitride film 10. The protective film 112 in the peripheral circuit region is formed along the upper surface of the silicon nitride film 110.

Subsequently, for example, n-type dopant (s) are ion-implanted into the surface of the semiconductor substrate 2 between the gate electrodes MG and between the gate electrodes SGD and MG by an ion implantation method using the defined gates as a self aligned mask for implant. The dopants are implanted to form as the source or the drain region 2a for the memory gates MG by heat treatment.

Next, the insulating films 13 and 113 are formed on the entire exposed surface. The insulating films 13 and 113 may be formed of, for example, a silicon oxide film, and are simultaneously formed in the memory cell region and the peripheral circuit region by, for example, a plasma CVD method exhibiting poor step coverage to yield gaps between the memory gate electrodes MG. In this case, the insulating films 13 and 113 may be formed in a plurality of layers in a plurality of steps by changing film formation gas conditions.

In order to increase integration, an interval between the gate electrodes MG of the memory cells MT and an interval between the gate electrode SGD of the selection transistor STD and the gate electrode MG of the memory cell MT are small. For this reason, the insulating film 13 is not likely to be embedded between the gate electrodes MG and SGD and between the gate electrodes MG and MG, and thus the insulating film 13 is formed to cover the only the upper surfaces between the gate electrodes MG and SGD and between the gate electrodes MG and MG and bridge across the gap between the upper surfaces of adjacent gate electrodes MG and SGD and MG and STD. As a result, a gap G, which is not filled by the insulating film 13, may be formed between the gate electrodes MG of the memory cells MT and between the gate electrode SGD of the selection transistor STD and the gate electrode MG of the memory cell MT. In this manner, the structures illustrated in FIGS. 5A to 5C may be formed.

Figure 6A:
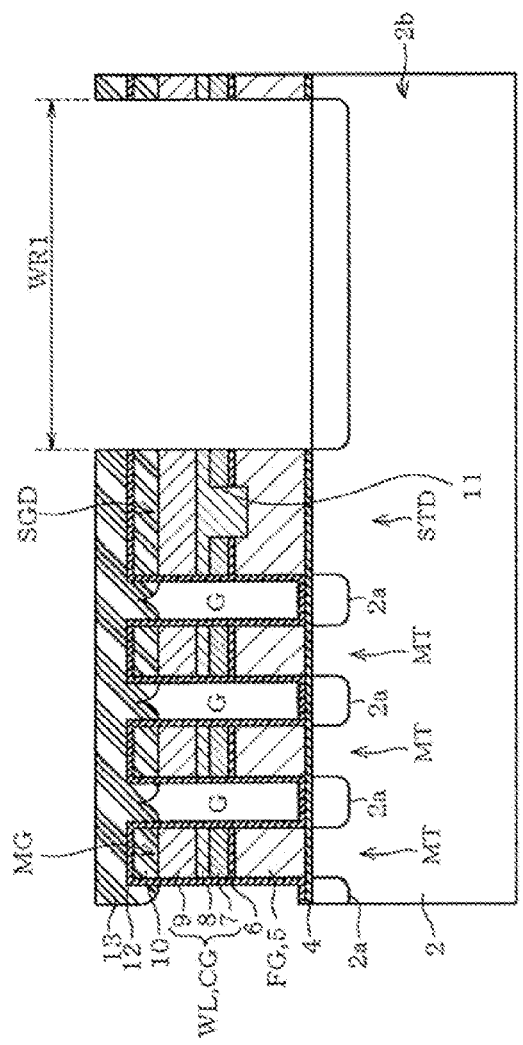
Figure 6B:
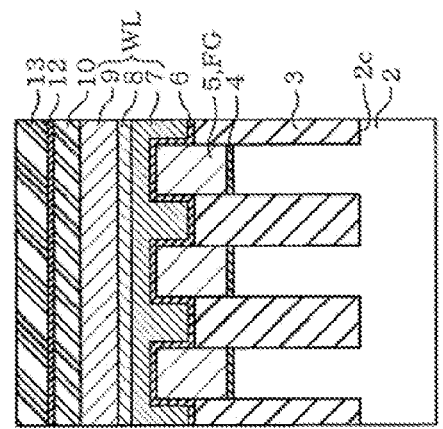

Subsequently, a resist mask (not illustrated) is formed on the insulating film 13 and is patterned by a lithography method, and anisotropic etching is performed on the stacked layer structure composed of the gate insulating film 4, the silicon film 5, the interelectrode insulating film 6, the silicon film 7, the silicon film 8 the tungsten film 9, the silicon nitride capping layer 10, the protective film 12 and insulating film 13 in a region WR1 (also see FIG. 2) where the bit line contact electrode CB (a source line contact electrode CS is also included) is formed, by an RIE method using the resist mask as a mask. Thus, the surface of the semiconductor substrate 2 within the region WR1 is exposed as illustrated in FIGS. 6A and 6B.

Figure 6C:
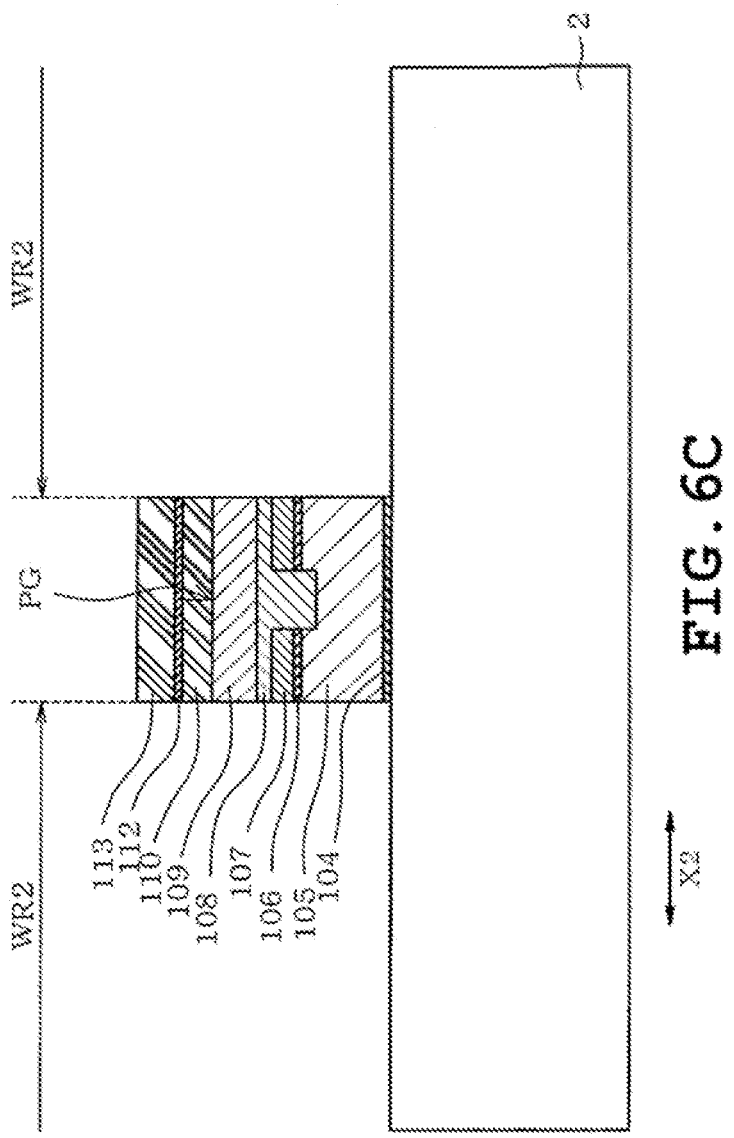

In addition, as illustrated in FIG. 6C, a resist mask (not illustrated) on the insulating film 113 is patterned by a lithography method, and anisotropic etching is performed on the stacked layer structure composed of the gate insulating film 104, the silicon film 105, the interelectrode insulating film 106, the silicon film 107, the silicon film 108 the tungsten film 109, the silicon nitride capping layer 110, the protective film 112 and insulating film 113 in a region WR2 on both sides of the gate electrode PG in the peripheral circuit region in the X2 direction, by an RIE method using the resist mask as a mask. Thus, the surface of the semiconductor substrate 2 of the gate electrode PG in the X2 direction is exposed. At this time, a region where the memory cells MT are formed and regions where the selection gate electrodes SGD and SGS are formed are masked by the resist mask, and thus are not processed.

Figures 7A, 7B:
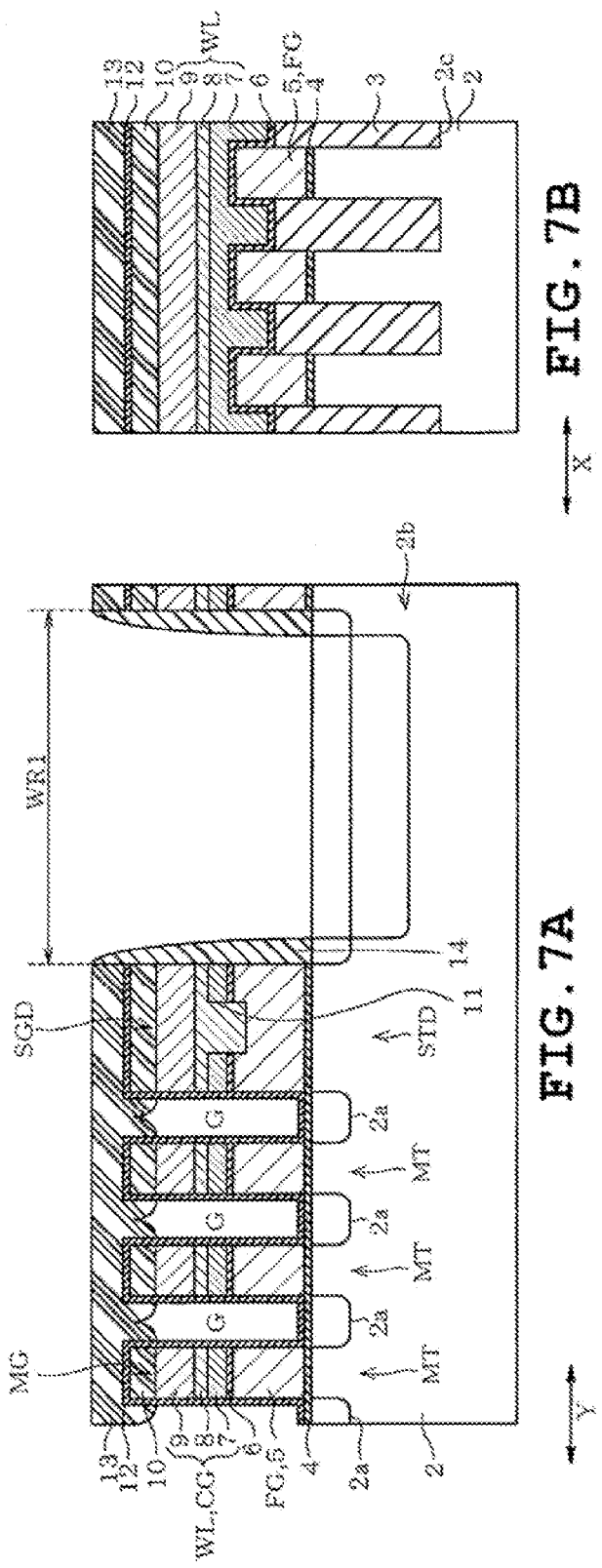
Figure 7C:
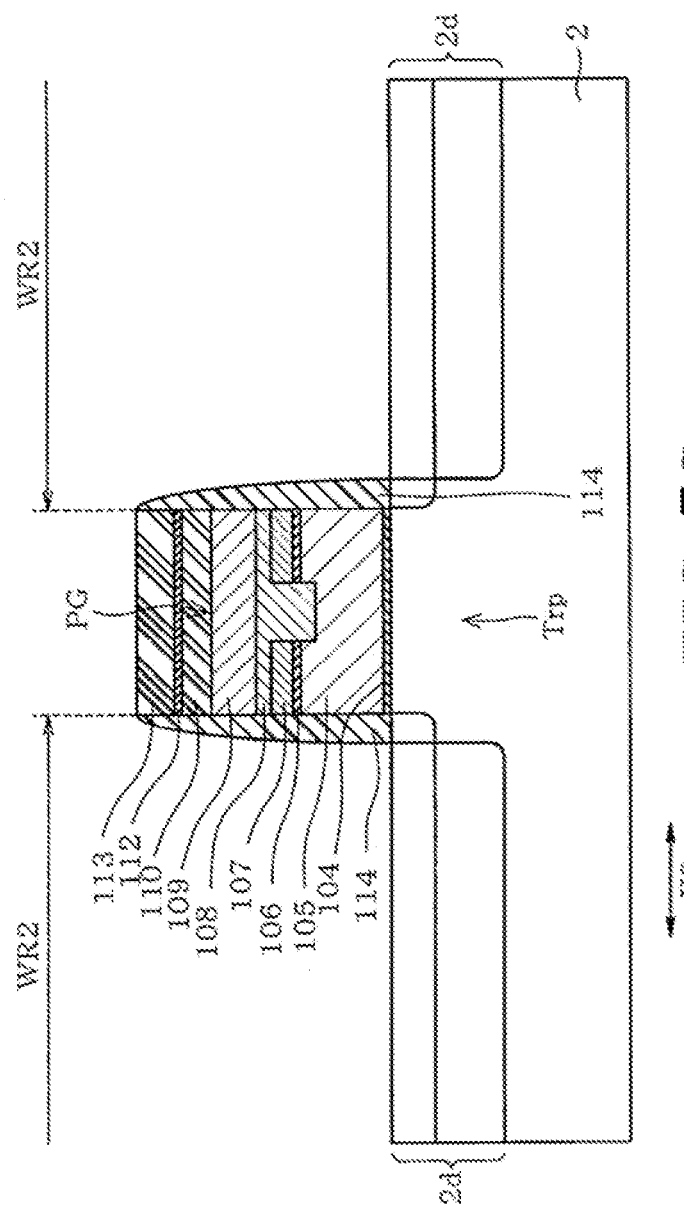

Next, as illustrated in FIGS. 7A to 7C, for example, n-type impurities are ion-implanted at a low concentration by an ion implantation method, and these impurities are introduced into the surface layer of the semiconductor substrate 2 in the regions WR1 and WR2. Further, the spacer films 14 and 114 are formed. The spacer films 14 and 114 are formed by depositing, for example, a silicon oxide layer by exposing a TEOS gas to the entire surface using an LPCVD method to have a uniform film thickness and then performing etch-back processing on the entire surface. The spacer films 14 and 114 may be simultaneously formed in the memory cell region and the peripheral circuit region.

As a result, as illustrated in FIG. 7A, the spacer film 14 is formed along the side surface of the structure in which the gate insulating film 4, the selection gate electrode SGD, the silicon nitride film 10, the protective film 12, and the insulating film 13 are stacked. As illustrated in FIG. 7C, the spacer film 114 is formed along the side surface of the structure in which the gate insulating film 104, the gate electrode PG, the silicon nitride film 110, the protective film 112, and the insulating film 113 are stacked in the region WR2 on both sides of the gate electrode PG. Further, for example, when n-type dopant(s) are ion-implanted at a high concentration by an ion implantation method, the dopants are introduced into the regions WR1 and WR2 and spacer films 14 and 114 act as a self aligning mask layer to limit the exposed area of the substrate into which the dopants are introduced.

Figure 8C:
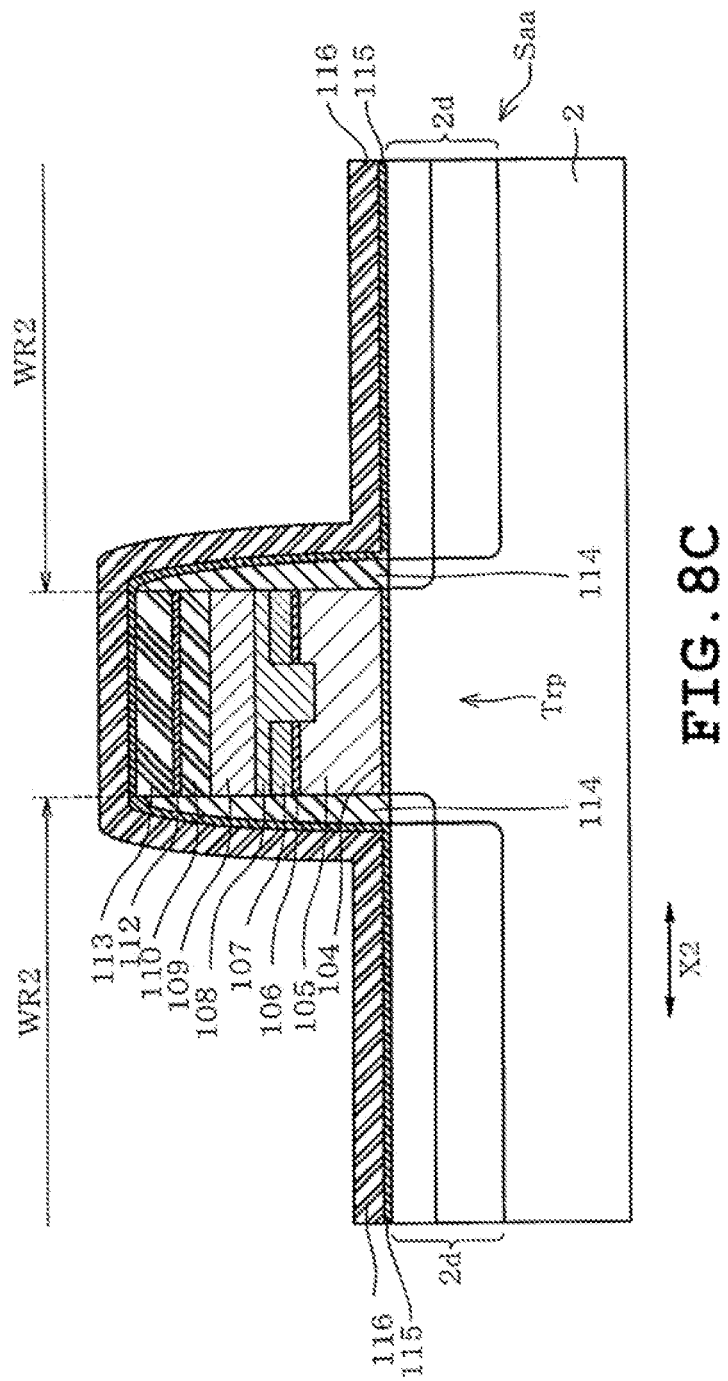

As illustrated in FIGS. 8A to 8C, the silicon oxide films 15 and 115 are formed on the entire surface as first liner films, and the silicon nitride films 16 and 116 are formed on the entire surface as second liner films. The silicon oxide films 15 and 115 may be formed at the same time using, for example, a CVD method. As illustrated in FIGS. 8A and 8B, the silicon oxide film 15 in the memory cell region is formed along the upper surface of the element region Sa of the semiconductor substrate 2, the side surface and the upper surface of the spacer film 14, and the upper surface of the insulating film 13. As illustrated in FIG. 8C, the silicon oxide film 115 in the peripheral circuit region is formed along the upper surface of the element region Saa of the semiconductor substrate 2, the side surface and the upper surface of the spacer film 114, and the upper surface of the insulating film 113.

The silicon nitride films 16 and 116 may be formed at the same time using, for example, a CVD method. As illustrated in FIGS. 8A and 8B, the silicon nitride film 16 is formed on the silicon oxide film 15. As illustrated in FIG. 8C, the silicon nitride film 116 is formed on the silicon oxide film 115.

Figure 9C:
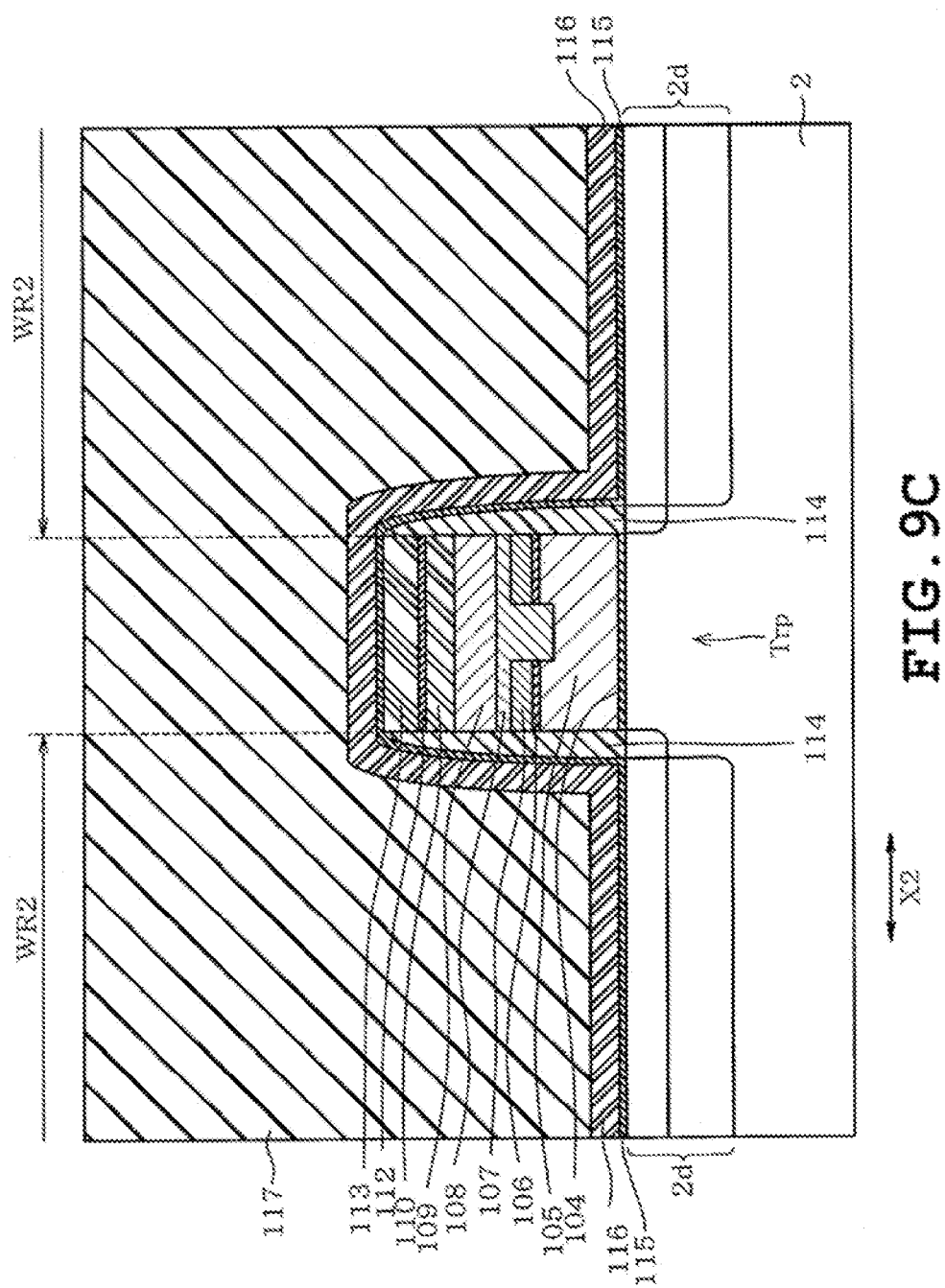

As illustrated in FIGS. 9A to 9C, the interlayer insulating films 17 and 117 are formed on the silicon nitride films 16 and 116, respectively. The interlayer insulating films 17 and 117 may be simultaneously formed of a silicon oxide film using, for example, a CVD method. At this point in time, the upper surfaces of the interlayer insulating films 17 and 117 may also be flattened using, for example, a CMP method.

Figure 10C:
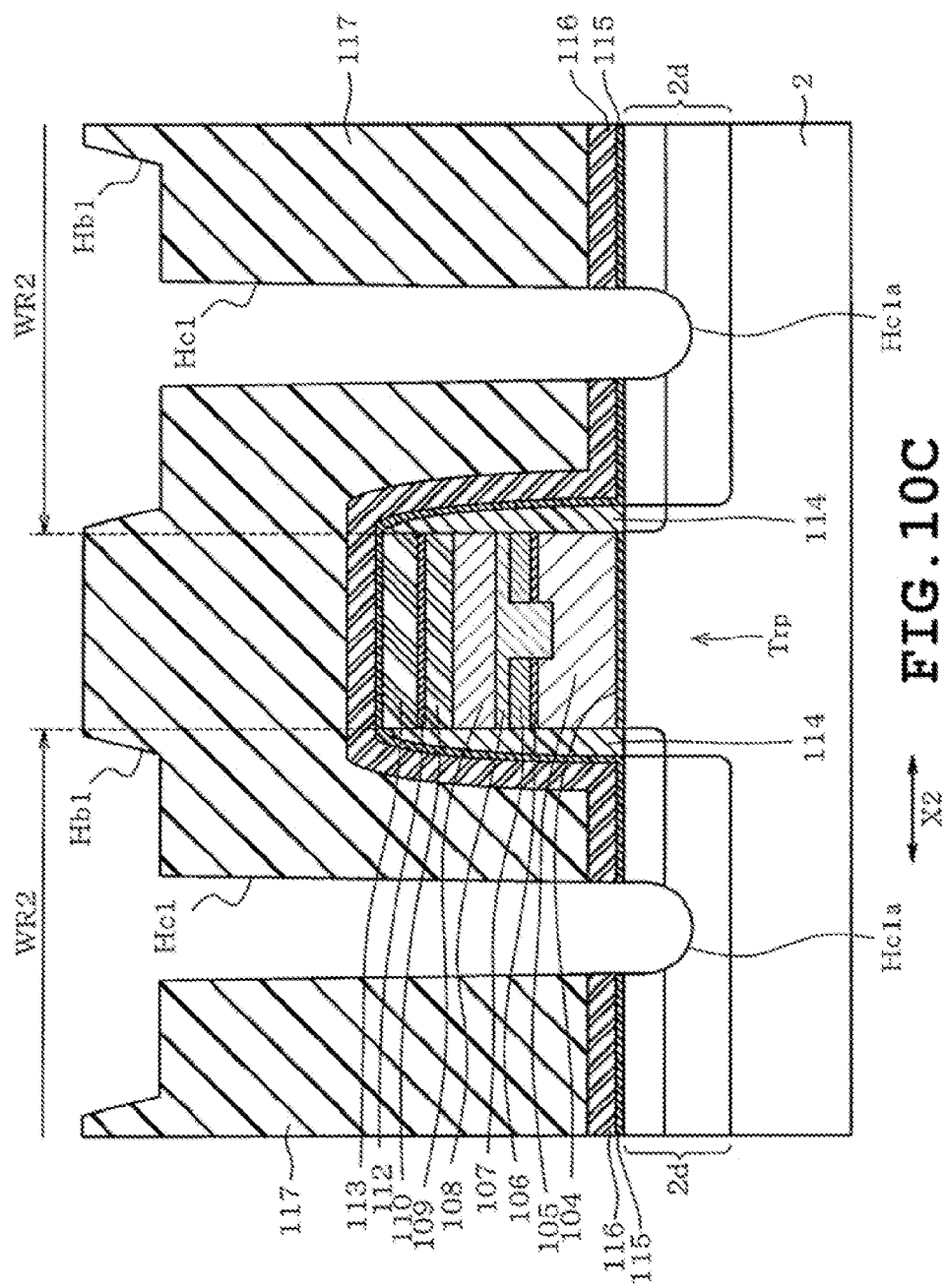

As illustrated in FIGS. 10A to 10C, after a resist mask (not illustrated) is formed on the interlayer insulating films 17 and 117, and patterning is performed thereon to form an opening at locations corresponding to the wiring layer 24 (contact electrode CB) and the wiring layer 124 (contact electrodes CP1 and CP2) within the regions WR1 and WR2, thereby forming the holes Ha, Hb, and Hb1. Next, the holes Hc and Hc1 are formed in the interlayer insulating films 17 and 117 using the silicon nitride films 16 and 116 as etch stop layers, respectively. Thereafter, the holes Hc, Hca, Hc1, and Hc1a are formed to reach the upper portion and inside of the semiconductor substrate 2. At this time, the holes Hb, Hc, and Hca of the bit line contact electrode CB (source line contact electrode CS is also included) and the holes Hb1, Hc1, and Hc1a for embedding the contact electrodes CP1 and CP2 are simultaneously formed in the memory cell region and the peripheral circuit region.

Figures 11A, 11B:
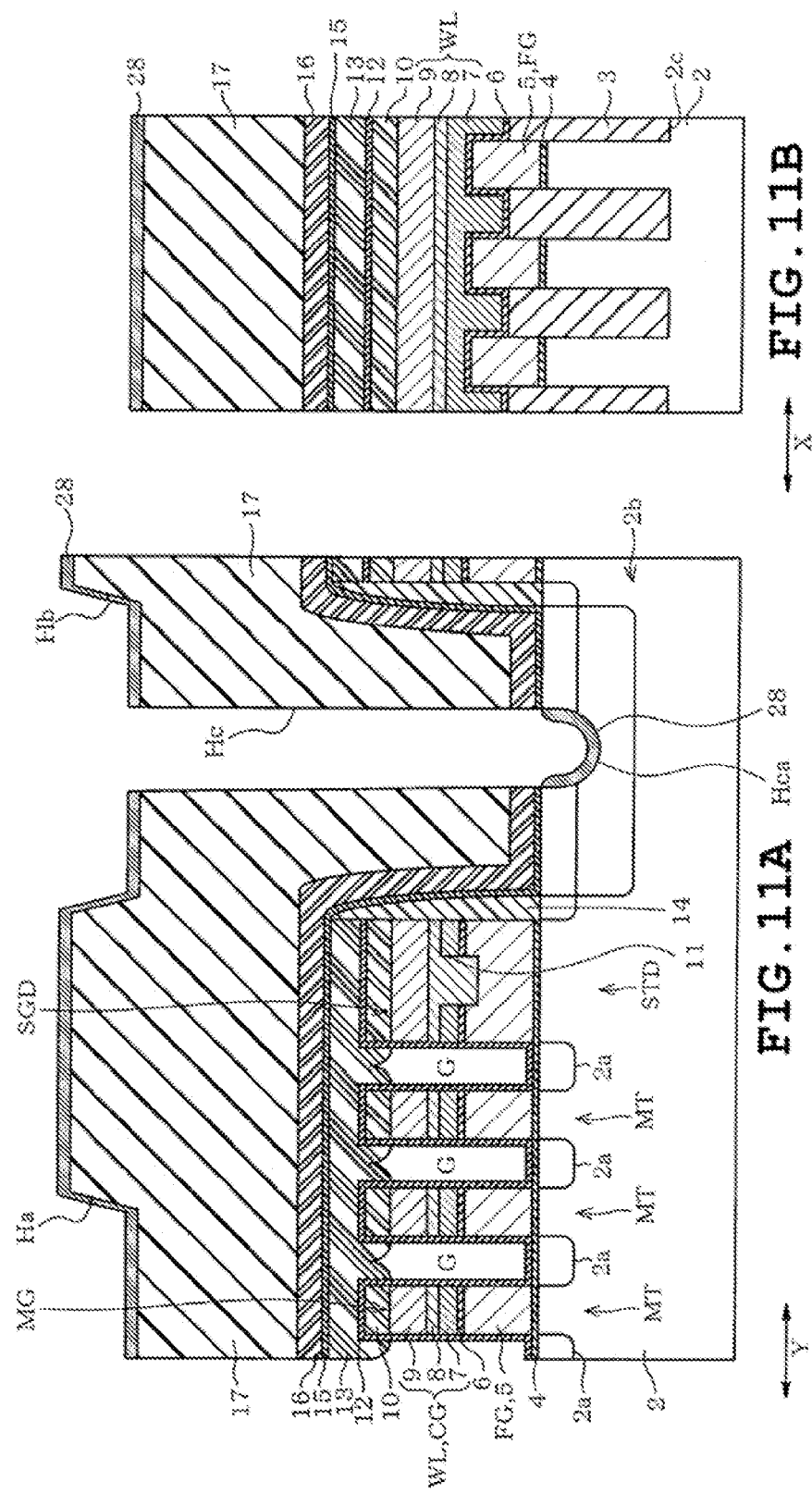
Figures 12A, 12B:
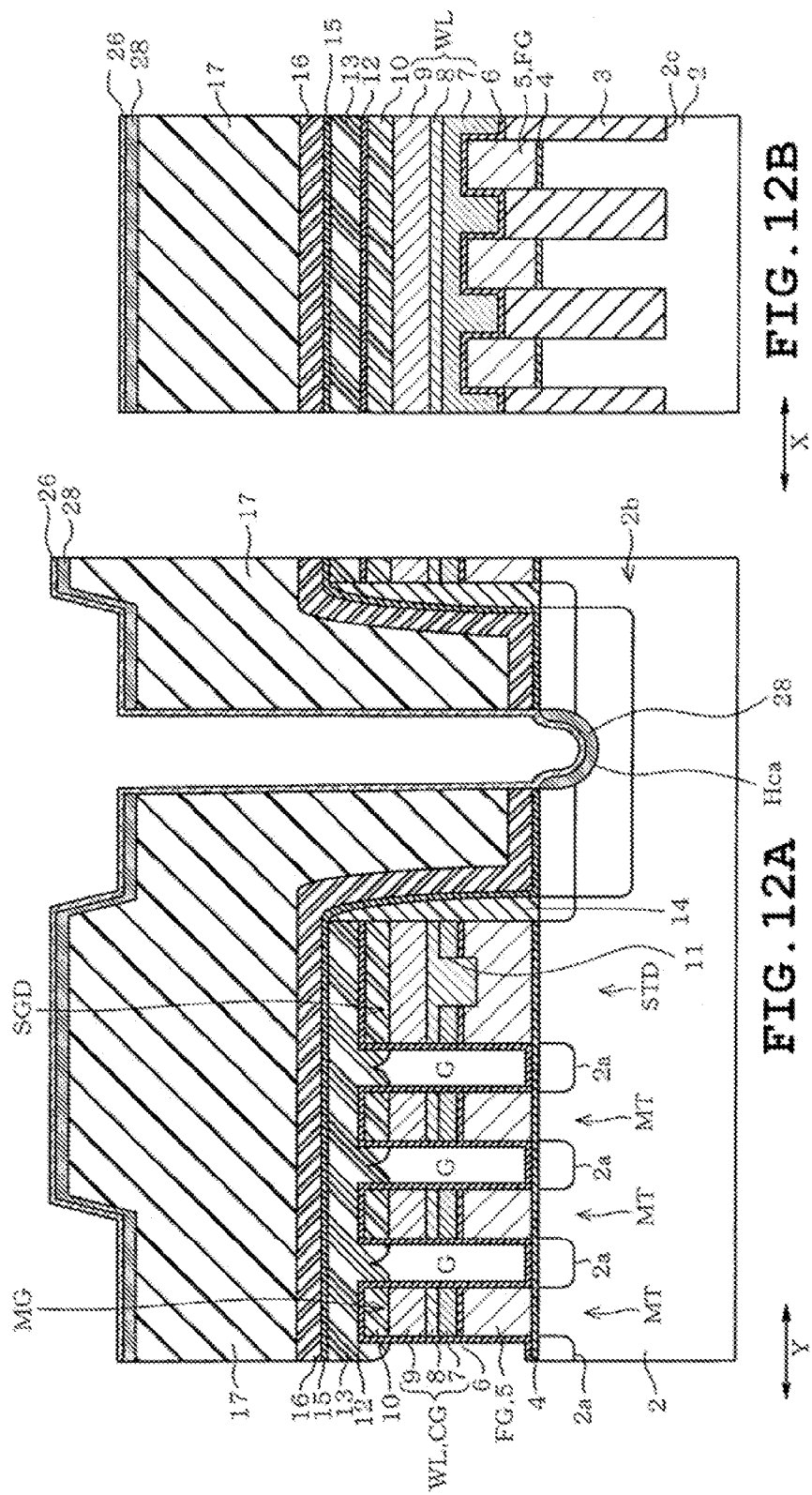
Figure 12C:
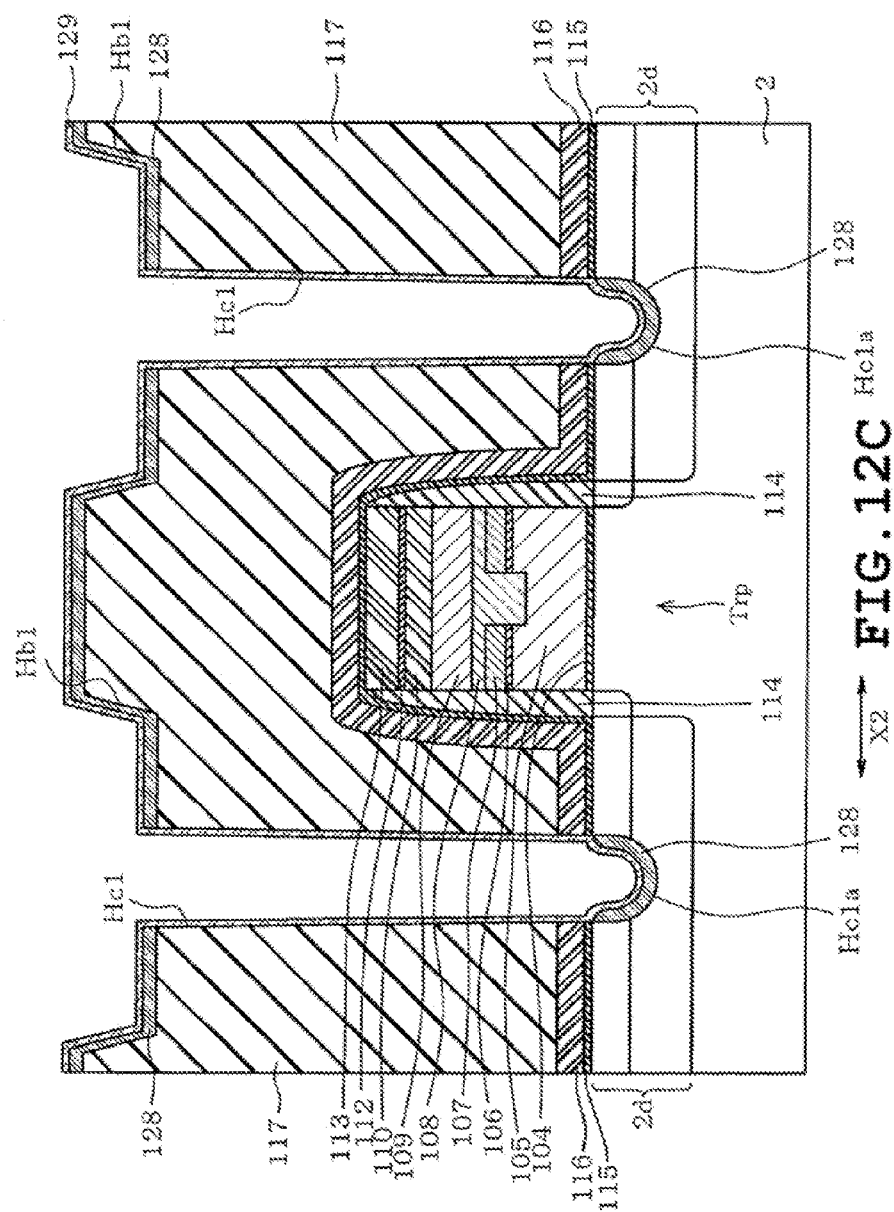

Subsequently, as illustrated in FIGS. 11A to 11C, the metal films 28 and 128 are formed along the inner surfaces of the holes Hb, Hb1, Hc, and Hc1. At this time, the metal films 28 and 128 are simultaneously deposited using a CVD method under a low-temperature condition of, for example, less than 600° C.

In particular, the metal films 28 and 128 are likely to be deposited in the bottom regions of the holes Hb, Hb1, Hc, and Hc1, and are not likely to be formed on the side surfaces of the holes Hb, Hb1, Hc, and Hc1 as compared with the bottom regions. In particular, FIGS. 11A to 11C illustrate examples in which the metal of the metal films 28, 128 is not significantly formed on the inner surfaces (side walls) of the holes Hc and Hc1. Here, as illustrated in FIGS. 11A to 11C, an aspect ratio of each of the holes Hc and Hc1 is higher than an aspect ratio of each of the holes Ha, Hb, and Hb1. For this reason, the metal films 28 and 128 are formed thinly on the side surfaces of the holes Hb and Hb1, respectively.

The metal films 28 and 128 are deposited in the holes Hca and Hc1a extending into the semiconductor substrate 2, respectively, to a thickness of, for example, approximately 10 nm. The metal films are deposited under a relatively low-temperature condition. Thus, even when the surface of the semiconductor substrate 2 is exposed, a silicidation reaction does not occur during deposition of the metal films 28, 128.

Subsequently, the amorphous silicon films 26 and 126 are formed on the metal films 28 and 128, respectively. At this time, the amorphous silicon films 26 and 126 are isotropically formed using film formation conditions having better conformality than film formation conditions of the above-mentioned metal films 28 and 128 and the like. The amorphous silicon film 26 is formed along the inner surface of the hole Hc, and the amorphous silicon film 126 is formed along the inner surface of the hole Hc1. The amorphous silicon films 26 and 126 are isotropically formed along the inner surfaces of the holes Hb, Hb1, Hc, and Hc1 to have a film thickness of, for example, approximately 5 nm. Meanwhile, since the metal films 28 and 128 are formed respectively within the holes Hca and Hc1a in the semiconductor substrate 2, the amorphous silicon films 26 and 126 are formed along the upper surfaces of the metal films 28 and 128 within the holes Hca and Hc1a, respectively.

Subsequently, heat treatment is performed by rapid thermal anneal (RTA) under a temperature condition of 900° C. or higher (for example, 930° C.). Since the heat treatment is performed under a high-temperature condition, the amorphous silicon films 26 and 126 are crystallized, and thus change to polycrystalline silicon. Consequently, hereinafter, the crystallized amorphous silicon films will be referred to as the silicon films 26 and 126. In addition, an activation rate of impurities injected into the semiconductor substrate 2 does not change or increases by performing the heat treatment at a temperature in the above-mentioned range, and thus the impurities are not likely to be deactivated.

Figure 13C:
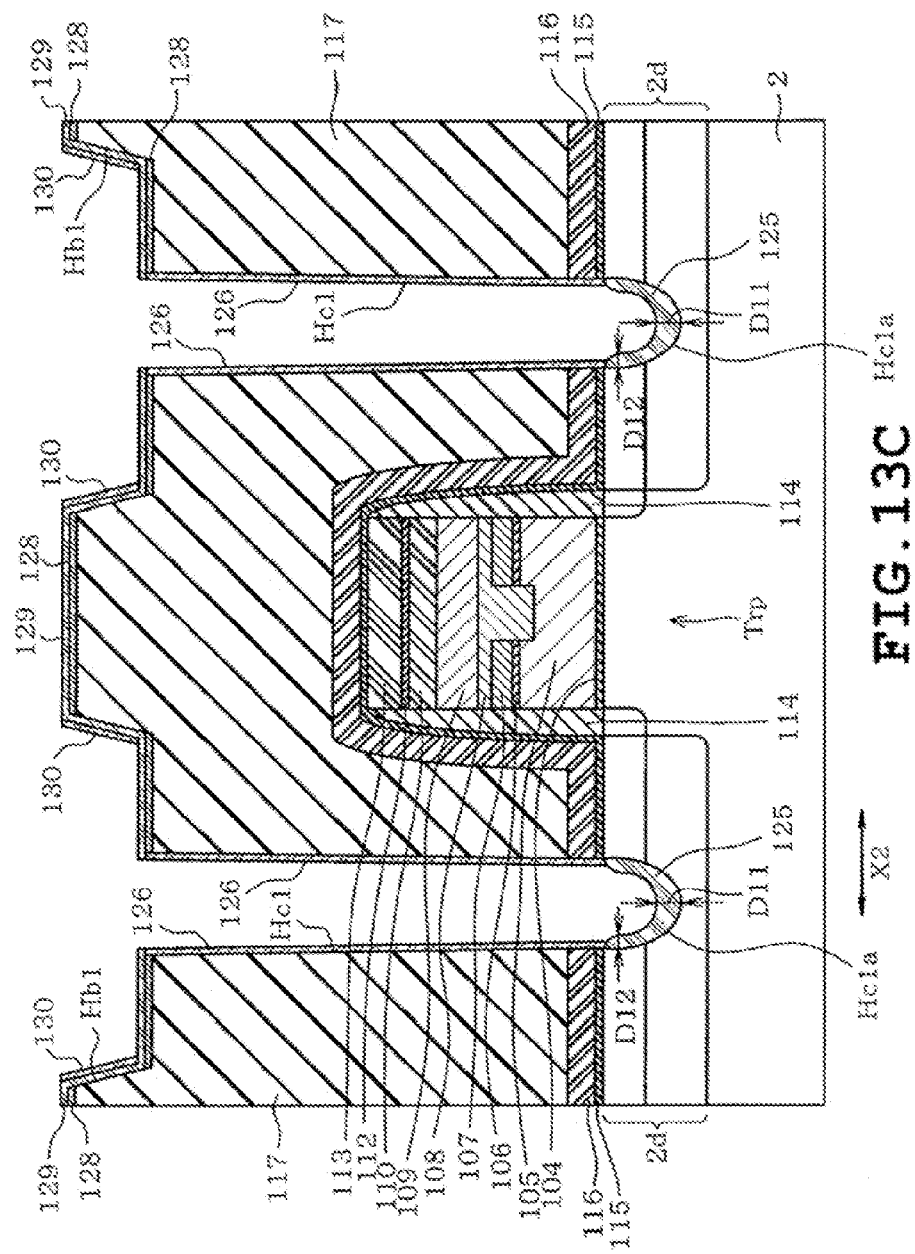

At this time, a silicidation reaction mainly occurs between each of the metal films 28 and 128 formed within the respective holes Hca and Hc1a of the semiconductor substrate 2 and each of the silicon films 26 and 126 or silicon configuring the semiconductor substrate 2. As a result, the metal silicide films 25 and 125 are formed as illustrated in FIGS. 13A to 13C. Similarly, a silicidation reaction occurs between each of the silicon films 26 and 126 and each of the metal films 28 and 128 formed within the respective holes Hb and Hb1. As a result, the metal silicide films 29 and 129 are formed.

Meanwhile, a portion in which the metal film. 28 is formed along the inner surface of the hole Hb is thinner than other portions, and a portion in which the metal film 128 is formed along the inner surface of the hole Hb1 is also thinner than other portions. For this reason, a small amount of silicidation reaction occurs in the metal silicide films 29 and 129, and the silicon films 30 and 130 may remain along the inner surfaces of the metal silicide films 29 and 129, respectively. In this embodiment, the details are illustrated in FIGS. 13A to 13C. Meanwhile, the silicon films 30 and 130 may not remain.

Figure 14C:
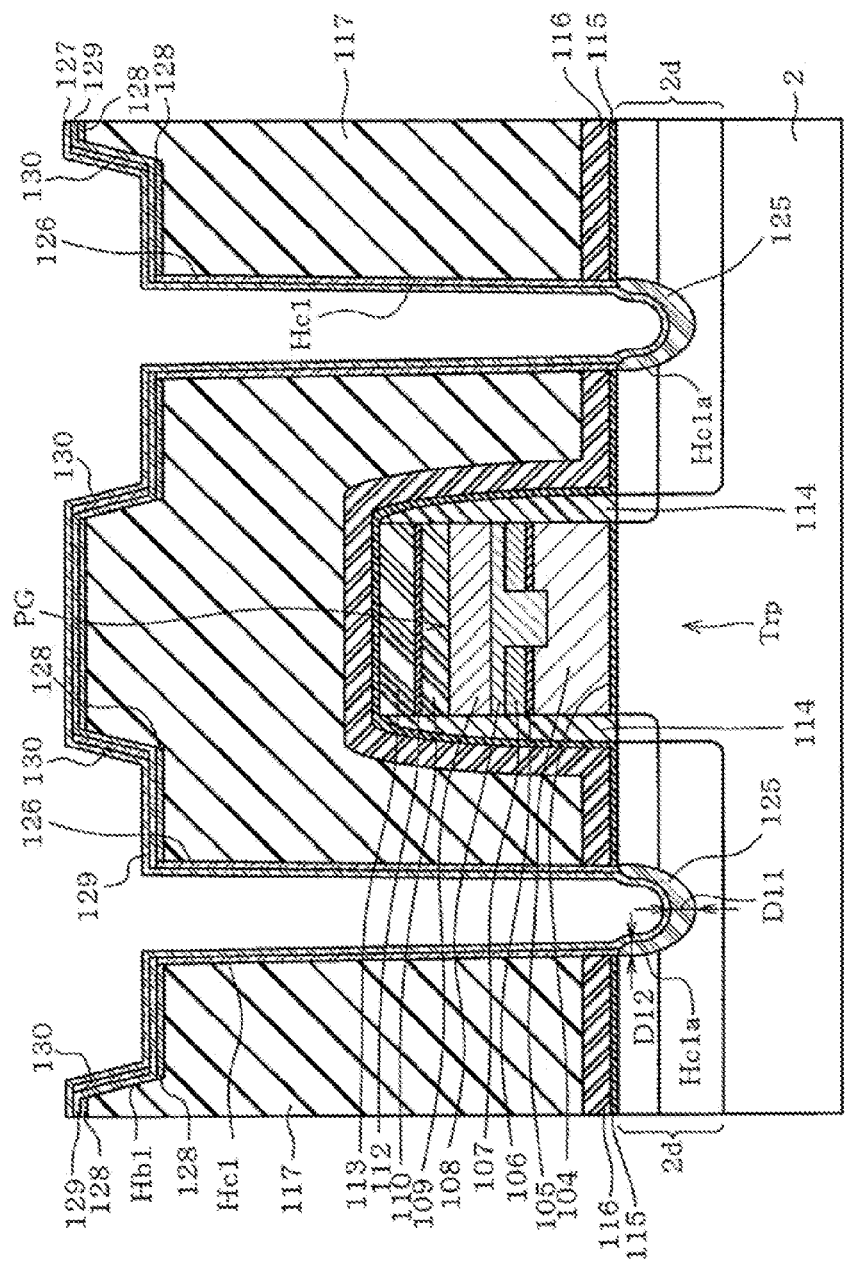

Next, as illustrated in FIGS. 14A to 14C, for example, titanium nitride (TiN) serving as the barrier metal film 27 and 127 is deposited on a formed film after annealing. The barrier metal films 27 and 127 may be isotropically formed at the same time using, for example, a CVD method, to have a film thickness of, for example, 5 nm.

Figures 15A, 15B:
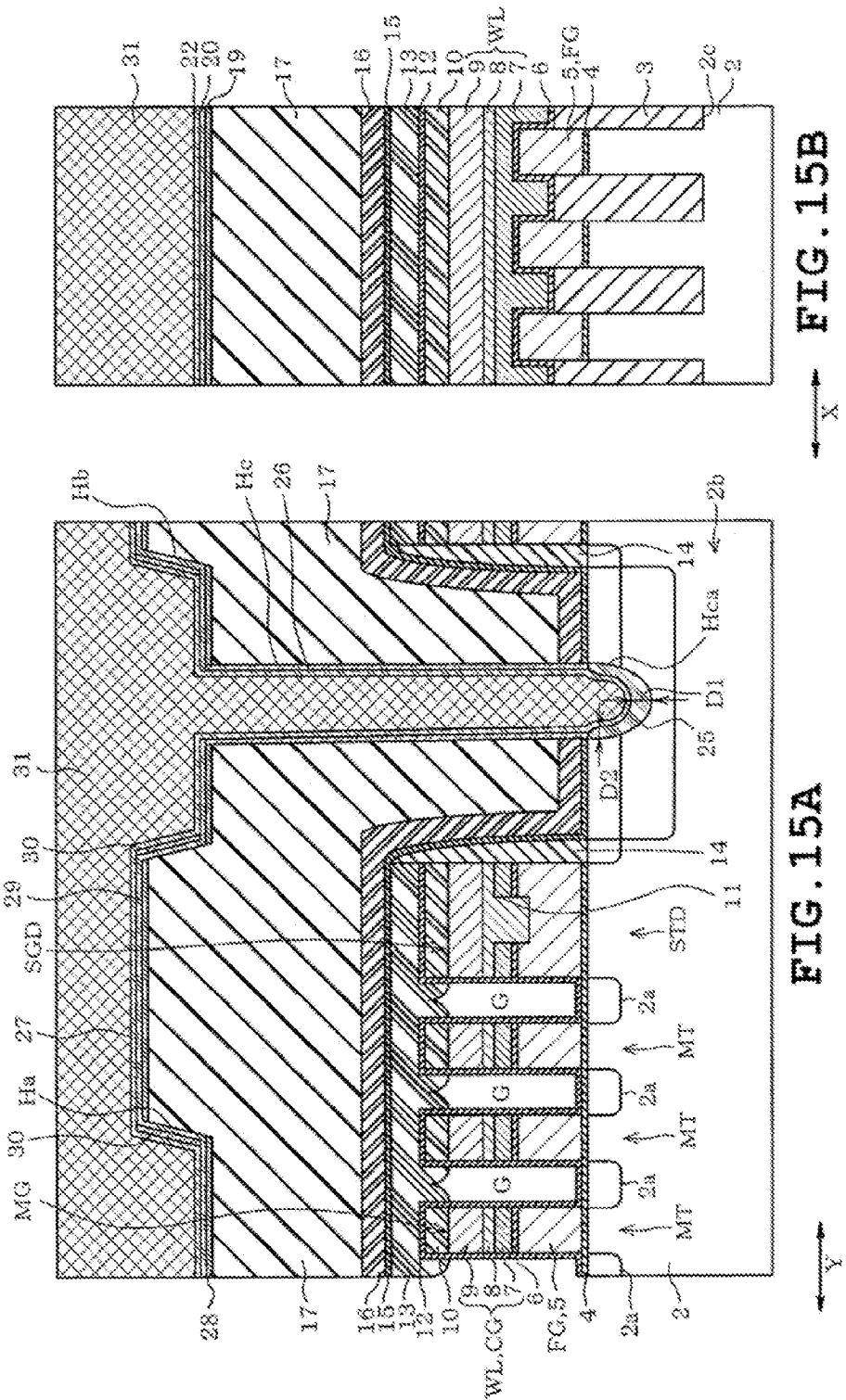
Figure 15C:
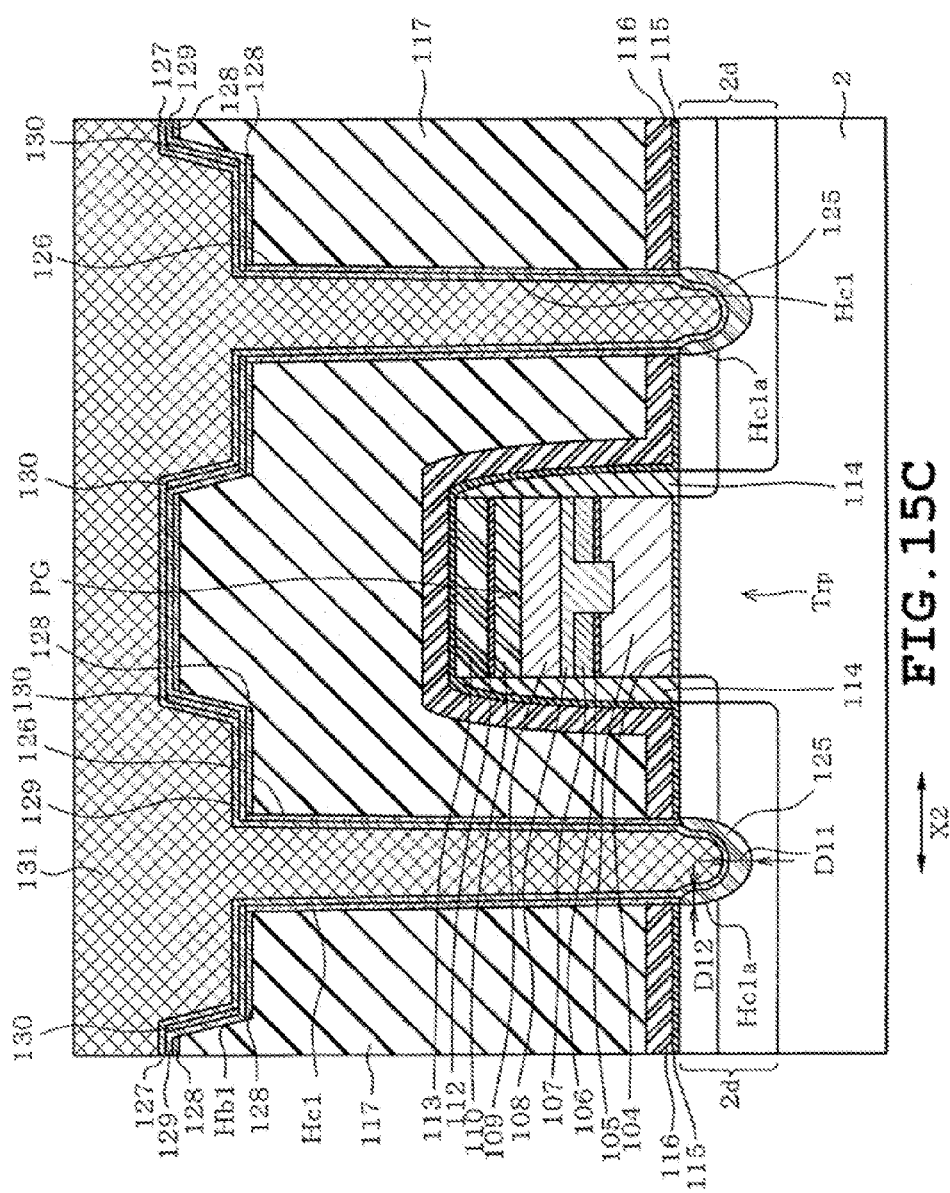

Next, as illustrated in FIGS. 15A to 15C, the metal films 31 and 131 are formed on the barrier metal films 27 and 127, respectively. The metal films 31 and 131 may be formed by simultaneously embedding, for example, a tungsten (W) film within the holes Hb, Hb1, Hc, and Hc1 on the inner sides of the barrier metal films 27 and 127 using, for example, a CVD method. In addition, the metal films may be formed using a PVD method. At this time, the metal films 31 and 131 may be embedded not only within the respective holes Hc and Hc1 located at the lower portions but also within the respective holes Hb and Hb1 located at the upper portions. Then, the metal films 31 and 131 are flattened by a CMP method using the upper surfaces of the interlayer insulating films 17 and 117 as polish stop layers. Thus, as illustrated in FIGS. 4A to 4D, it is possible to form the wiring portion 18 and the wiring layers 24 and 124 having high reliability. Further, upper layer wirings such as the bit lines BL are formed on the wiring portion 18, the wiring layers 24 and 124, and the like, but a description thereof will be omitted. In this manner, the semiconductor device 1 may be manufactured.

According to this embodiment, the amorphous silicon films 26 and 126 are formed on the metal films 28 and 128, respectively, and thus a diffusing species of silicon is provided separately during a silicidation reaction of each of the metal silicide films 25 and 125, 29, 129. Accordingly, it is possible to suppress the generation of a gap within the silicon of the semiconductor substrate 2 as a result of an excess reaction of titanium or other metal and silicon in the silicide reaction. Thus, it is possible to suppress overreaction between the semiconductor substrate 2 and each of the metal films 28 and 128 and to prevent a problem from occurring due to an open failure caused by a gap at the lower ends of the respective contact portions 24b and 124b.

OTHER EMBODIMENTS

In addition to the description in the above-described embodiment, the following modifications may be made.

Although a silicon monocrystalline semiconductor substrate is used as the semiconductor substrate 2, other types of substrates such as SiGe may be used as long as the substrate contains silicon.

Although a NAND type flash memory device is the semiconductor device 1, semiconductor devices such as a NOR-type flash memory device, a nonvolatile semiconductor memory device such as an EEPROM, and a logic circuit may be the semiconductor device 1.

(Others)

An example of a superordinate concept, a middle concept, or a subordinate concept of each of the embodiments or the modification example described above or an example of a concept capable of being configured by combining some or all of configurations of the embodiments and the modification example may be expressed, for example, in the following modes in addition to being expressed as described in claims.

Mode 1

A method of manufacturing a semiconductor device, the method including:

forming an interlayer insulating film on a semiconductor substrate containing silicon;

forming a hole in the interlayer insulating film;

forming a metal film under a temperature condition in which the metal film does not react with the silicon during forming the metal film in the hole of the interlayer insulating film;

forming an amorphous silicon film on the metal film under a temperature condition in which the semiconductor substrate does not react with the metal film;

performing heat treatment on the amorphous silicon film, the metal film, and the semiconductor substrate to thereby cause a silicidation reaction between the metal film and each of the amorphous silicon film and the silicon of the semiconductor substrate;

forming a barrier metal film in the hole after the heat treatment; and forming a metal film on an inner side of the barrier metal film.

Mode 2

The method according to [Mode 1], wherein the metal film is formed of a tungsten film.

Mode 3

The method according to [Mode 1], wherein the metal film is formed of a titanium (Ti) film.

Mode 4

The method according to [Mode 1], wherein the barrier metal film is formed of a titanium nitride (TiN) film.

Mode 5

A semiconductor device manufactured by the manufacturing method according to [Mode 1], the device including:
a semiconductor substrate;
an interlayer insulating film that is formed on the semiconductor substrate and is provided with a first hole; and
a contact that is formed in the first hole of the interlayer insulating film,
wherein the contact includes a first silicon film along an inner surface of the first hole of the interlayer insulating film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate;
an interlayer insulating film on the semiconductor substrate and having a first hole extending therethrough;
a contact portion in the first hole of the interlayer insulating film;
a first wiring portion that is connected with the contact portion in a second hole formed in an upper portion of the interlayer insulating film,
wherein the contact portion includes a first silicon film along an inner surface of the first hole of the interlayer insulating film, and wherein the first wiring portion in the second hole includes a second silicon film.

2. The semiconductor device according to claim 1, wherein the wiring portion includes:
a main contact film comprising tungsten (W) at a core portion in the second hole, and
a barrier metal film between a metal silicide film and the main contact film.

3. The semiconductor device according to claim 1, further comprising:
a metal silicide film between the interlayer insulating film and the first silicon film.

4. The semiconductor device according to claim 3, further comprising:
a metal film between the interlayer insulating film and the metal silicide film.

5. The semiconductor device according to claim 4, wherein the metal film comprises titanium (Ti) or nickel (Ni).

6. The semiconductor device according to claim 3, wherein the metal silicide film is formed of titanium silicide (TiSi).

7. The semiconductor device according to claim 3,
wherein a third hole is formed in the semiconductor substrate,
wherein the metal silicide film is formed to come into contact with an inner surface of the third hole formed in the semiconductor substrate, and
wherein a thickness of a bottom portion of a contact surface between the metal silicide film and the third hole of the semiconductor substrate is a first thickness and a thickness of a side portion of a contact surface between the metal silicide film and the third hole of the semiconductor substrate is a second thickness, the first thickness is larger than the second thickness.

8. The semiconductor device according to claim 1, wherein the first silicon film is formed only above a main surface of the semiconductor substrate.

9. The semiconductor device according to claim 1, wherein the contact portion includes:
a main contact film, formed of tungsten (W), that is formed at a core portion in the first hole, and
a barrier metal film that is formed between the main contact film and the first silicon film.

10. The semiconductor device according to claim 1, wherein the contact portion includes:
a main contact film, formed of tungsten (W), that is formed at a core portion in the first hole, and
a barrier metal film that is formed between a metal silicide film and the main contact film.

11. The semiconductor device according to claim 1,
wherein the contact portion includes a main contact film comprising tungsten (W) at a core portion in the first hole, and
wherein the metal film is between a lower surface of the main contact film and an upper surface of the interlayer insulating film.

12. The semiconductor device according to claim 1,
wherein the wiring portion includes a main contact film comprising tungsten (W) at a core portion in the second hole, and
wherein the metal film is between a lower surface of the main contact film and an upper surface of the interlayer insulating film.

13. The semiconductor device according to claim 1, further comprising:
a second wiring portion in a fourth hole at an upper portion of the interlayer insulating film,
wherein the second wiring portion includes a third silicon film.

14. The semiconductor device according to claim 13,
wherein the second wiring portion includes a main wiring film comprising tungsten (W) at a core portion in the fourth hole, and
wherein the metal film is between a lower surface of the main wiring film and an upper surface of the interlayer insulating film.

15. A semiconductor device comprising:
a semiconductor substrate;
an interlayer insulating film on the semiconductor substrate and having a first hole extending therethrough and into the semiconductor substrate;

a contact portion in the first hole of the interlayer insulating film, and a first wiring portion that is connected with the contact portion in a second hole formed in an upper portion of the interlayer insulating film, wherein the contact portion includes a first silicon film along an inner surface of the first hole of the interlayer insulating film, and wherein the first wiring portion in the second hole includes a second silicon film.

16. The semiconductor device according to claim 15, wherein the wiring portion includes:

a main contact film comprising tungsten (W) at a core portion in the second hole, and a barrier metal film between a metal silicide film and the main contact film.

17. The semiconductor device according to claim 15, further comprising:

a metal silicide film between the interlayer insulating film and the first silicon film.

18. The semiconductor device according to claim 17, further comprising:

a metal film between the interlayer insulating film and the metal silicide film.

* * * * *